(12) United States Patent
Wood et al.

(10) Patent No.: US 11,404,610 B2
(45) Date of Patent: Aug. 2, 2022

(54) LIGHT FIXTURE WITH BROADBAND AND NARROW BAND EMITTERS

(71) Applicant: Electronic Theatre Controls, Inc., Middleton, WI (US)

(72) Inventors: Michael Wood, Austin, TX (US); David J. Cahalane, Dane, WI (US)

(73) Assignee: Electronic Theatre Controls, Inc., Middleton, WI (US)

(*) Notice: Subject to any disclaimer, the term of this patent is extended or adjusted under 35 U.S.C. 154(b) by 296 days.

(21) Appl. No.: 16/419,265

(22) Filed: May 22, 2019

(65) Prior Publication Data
US 2020/0373465 A1  Nov. 26, 2020

(51) Int. Cl.
*H01L 33/50* (2010.01)
*H05B 47/10* (2020.01)
(Continued)

(52) U.S. Cl.
CPC ........ *H01L 33/502* (2013.01); *C09K 11/7777* (2013.01); *F21K 9/20* (2016.08);
(Continued)

(58) Field of Classification Search
CPC ....... H01L 33/48; H01L 33/50; H01L 33/501; H01L 33/502; H05B 47/10; H05B 47/105; H05B 47/155; H05B 45/10; H05B 45/20
See application file for complete search history.

(56) References Cited

U.S. PATENT DOCUMENTS 7,709,774 B2  5/2010  Schulz et al.
7,898,665 B2  3/2011  Brukilacchio et al.
(Continued)

FOREIGN PATENT DOCUMENTS

WO  2006031753 A2  3/2006
WO  2014054290 A1  4/2014
(Continued)

OTHER PUBLICATIONS

Search and Examination Report for related Application No. GB2004364.2 dated Aug. 7, 2020 (5 pages).
(Continued)

*Primary Examiner* — Jason Crawford
(74) *Attorney, Agent, or Firm* — Michael Best & Friedrich LLP

(57) ABSTRACT

A light fixture includes a first phosphor-converted light-emitting diode ("PCLED") emitting light in a first PCLED wavelength range having first PCLED upper and lower bounds, a first direct light-emitting diode ("DLED") emitting light in a first DLED wavelength range having first DLED upper and lower bounds, a second PCLED emitting light in a second PCLED wavelength range having second PCLED upper and lower bounds, and a second DLED emitting light in a second DLED wavelength range having second DLED upper and lower bounds. The first PCLED upper bound has a higher wavelength value than the first DLED upper bound. The first PCLED lower bound has a lower wavelength value than the first DLED lower bound. The second PCLED upper bound has a higher wavelength value than the second DLED upper bound. The second PCLED lower bound has a lower wavelength value than the second DLED lower bound.

20 Claims, 12 Drawing Sheets

(51) Int. Cl.
*F21K 9/20* (2016.01)
*C09K 11/77* (2006.01)
*F21V 15/01* (2006.01)
*F21V 19/00* (2006.01)

(52) U.S. Cl.
CPC ............ *F21V 15/01* (2013.01); *F21V 19/001* (2013.01); *H05B 47/10* (2020.01)

(56) References Cited

U.S. PATENT DOCUMENTS

| | | | |
|---|---|---|---|
| 8,013,533 | B2 | 9/2011 | De Rijck et al. |
| 8,390,207 | B2 | 3/2013 | Dowling et al. |
| 8,403,523 | B2* | 3/2013 | Gerlach ................ H05B 47/10 362/249.02 |
| 8,508,127 | B2 | 8/2013 | Negley et al. |
| 8,921,875 | B2 | 12/2014 | LeToquin et al. |
| 9,022,598 | B2 | 5/2015 | Lee |
| 9,159,885 | B2 | 10/2015 | Ouderkirk et al. |
| 9,500,327 | B2* | 11/2016 | Oepts ........................ F21K 9/64 |
| 10,077,886 | B2 | 9/2018 | Ouderkirk et al. |
| 10,109,773 | B2 | 10/2018 | Todorov et al. |
| 2006/0105482 | A1 | 5/2006 | Alferink et al. |
| 2007/0223219 | A1* | 9/2007 | Medendorp, Jr. ......... F21K 9/00 257/E33.001 |
| 2009/0108269 | A1* | 4/2009 | Negley ................. H01L 27/156 257/E33.061 |
| 2011/0037413 | A1 | 2/2011 | Negley et al. |
| 2011/0050125 | A1* | 3/2011 | Medendorp, Jr. .... C09K 11/623 362/231 |
| 2012/0099303 | A1* | 4/2012 | Li ....................... H01L 25/0753 362/231 |
| 2012/0300452 | A1* | 11/2012 | Harbers .................... F21K 9/64 362/231 |
| 2013/0114242 | A1* | 5/2013 | Pickard ................... F21K 9/232 362/84 |
| 2013/0264947 | A1* | 10/2013 | Ouderkirk ............. H01L 33/507 257/89 |
| 2014/0111985 | A1* | 4/2014 | Harbers .................... F21K 9/64 362/231 |
| 2014/0225137 | A1* | 8/2014 | Krames .................... F21V 9/08 257/89 |
| 2014/0240612 | A1* | 8/2014 | Gotou ....................... F21K 9/90 362/613 |
| 2015/0131259 | A1* | 5/2015 | Ouderkirk ............... F21K 9/64 362/84 |
| 2015/0228868 | A1* | 8/2015 | Ouderkirck ............. F21V 7/00 362/84 |
| 2016/0076736 | A1* | 3/2016 | Van Bommel ........... F21V 9/40 362/276 |
| 2016/0290573 | A1* | 10/2016 | Allen ...................... G02B 5/206 |
| 2019/0148605 | A1* | 5/2019 | Mu ......................... H01L 33/50 257/98 |
| 2020/0373465 | A1* | 11/2020 | Wood .................... H01L 33/502 |

FOREIGN PATENT DOCUMENTS

| | | | |
|---|---|---|---|
| WO | 2014068440 | A1 | 5/2014 |
| WO | 2018140727 | A1 | 8/2018 |

OTHER PUBLICATIONS

Examination Report issued from the United Kingdom Patent Office for related Application No. GB2004364.2 dated Jan. 21, 2022 (3 Pages).

* cited by examiner

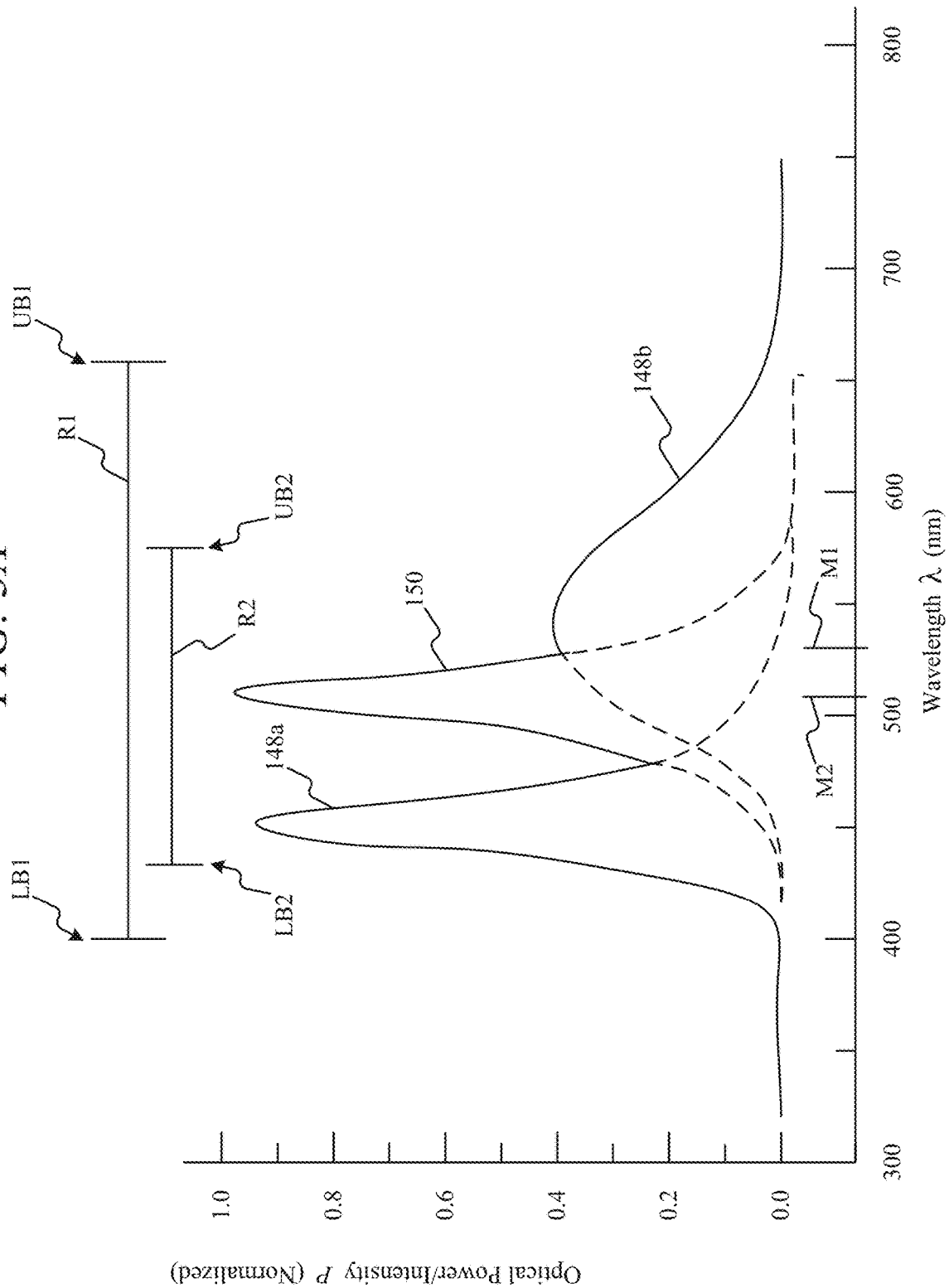

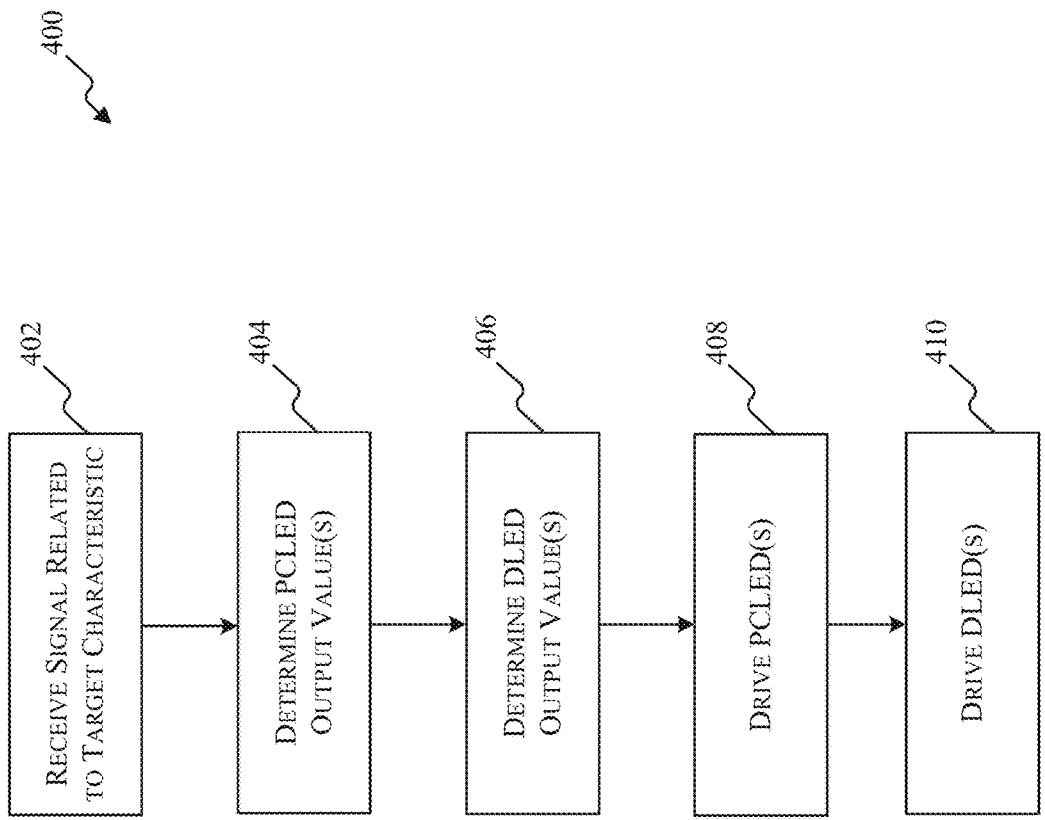

LIGHT FIXTURE WITH BROADBAND AND NARROW BAND EMITTERS

FIELD

Embodiments described herein relate to controlling the spectral content of an output of a light fixture.

SUMMARY

Some light fixtures include phosphor-converted light-emitting diodes ("PCLEDs"). A PCLED includes a light-emitting diode ("LED") that emits light that can be blue, ultra-violet, or the like. A layer of phosphor material is applied onto a surface of the LED. Radiation emitted from the LED is absorbed by the phosphor material. Radiation energy absorbed by the phosphor material is then re-emitted as light having a longer wavelength in the visible range of the electromagnetic spectrum. The light produced by the phosphor material is often yellow. Some PCLEDs include the layer of phosphor material thin enough to allow some of the light from the LED, such as blue light, to leak through the layer of phosphor material. The combination of the blue light that leaks through the layer of phosphor material with, for example, yellow light produced by the phosphor material results in light that is perceived as white by the human eye.

Light fixtures including these PCLEDs typically produce light that is considered to be broadband (e.g., a range on the electromagnetic spectrum, where the light in the range has an intensity value of at least 1% of peak intensity, that is at least 100 nanometers [nm] wide). The broadband light produced by the PCLEDs may be distributed in a continuous band along the electromagnetic spectrum or may have peaks in the band. These PCLEDs are suitable for producing white light, which can be "warm" or "cool." However, PCLEDs are unsuitable for achieving saturated colors. Specifically, broadband light emitted from PCLEDs prevents light fixtures equipped with PCLEDs from producing light that falls on the electromagnetic spectrum in a relatively narrow band (i.e., not broadband).

Other light fixtures include direct LEDs ("DLEDs") that emit light in a relatively narrow range on the electromagnetic spectrum. These DLEDs do not include a phosphor material layer. Such light fixtures often include a mix of red, green, and blue LEDs and can be referred to as RGB LED fixtures. The combination of the red light, the green light, and the blue light results in light which is perceived as white by the human eye. RGB LED fixtures allow for control over the exact color of the light produced by controlling the light intensity from each of the colors of LEDs using, for instance, pulse width modulation ("PWM"). Although RGB LED fixtures are good for color saturation, white light produced by RGB LED fixtures is hardware-intensive when compared to PCLED fixtures. For example, to create white light, an RGB LED fixture requires at least three LEDs (one of each of red, green, and blue) to illuminate at a similar intensity and at the same time. Powering three LEDs to create white light with an RGB LED fixture requires more energy than powering a single LED in a PCLED fixture. Further, RGB LED fixtures tend to render pastel colors that appear relatively unnatural when compared to a natural light source or an ideal light source.

Embodiments described herein provide a light fixture that utilizes one or more PCLEDs to render white light and pastel light and one or more DLEDs to render specific saturated colors. With both PCLEDs and DLEDs, the light fixture is capable of good color rendering as well as good color saturation. The inclusion of PCLEDs further improves the overall efficacy of the light fixture without compromising color rendering. If at least one PCLED and at least one DLED in such a light fixture are illuminated simultaneously, the produced light can have a wavelength range with a different width on the electromagnetic spectrum than would be possible with either the PCLED or the DLED alone. Additionally or alternatively, the amount of color saturation can be tuned by having one or both of the PCLED and the DLED illuminated in a given instance. This variability allows for adjustment of the light fixture's wavelength range width on the electromagnetic spectrum and the intensity of individual color bands on the electromagnetic spectrum.

Embodiments described herein provide a light fixture that includes a housing, a first light-emitting diode ("LED") disposed in the housing, a first phosphor layer associated with the first light-emitting diode, a second LED disposed in the housing, a second phosphor layer associated with the second LED, a third LED disposed in the housing, and a fourth LED disposed in the housing. The first phosphor layer and the first LED form a first phosphor-converted light-emitting diode ("PCLED"). The second phosphor layer and the second LED form a second PCLED. The first PCLED emits light in a first PCLED wavelength range including a first PCLED upper bound and a first PCLED lower bound. The second PCLED emits light in a second PCLED wavelength range including a second PCLED upper bound and a second PCLED lower bound. The third LED emits light in a third LED wavelength range including a third LED upper bound and a third LED lower bound. The fourth LED emits light in a fourth LED wavelength range including a fourth LED upper bound and a fourth LED lower bound. The first PCLED upper bound of the first PCLED wavelength range is higher than the third LED upper bound of the third LED wavelength range. The first PCLED lower bound of the first PCLED wavelength range is lower than the third LED lower bound of the third LED wavelength range. The second PCLED upper bound of the second PCLED wavelength range is higher than the fourth LED upper bound of the fourth LED wavelength range. The second PCLED lower bound of the second PCLED wavelength range is lower than the fourth LED lower bound of the fourth LED wavelength range.

Embodiments described herein provide a lighting system. The lighting system includes a light fixture and a controller. The light fixture projects light therefrom. The light fixture includes a first PCLED that emits light in a first PCLED wavelength range. The light fixture also includes a first DLED that emits light in a first DLED wavelength range. The light fixture further includes a second PCLED that emits light in a second PCLED wavelength range. The light fixture also further includes a second DLED that emits light in a second DLED wavelength range. The first DLED wavelength range falls completely within the first PCLED wavelength range. The second DLED wavelength range falls completely within the second PCLED wavelength range. The controller receives a control signal corresponding to a target characteristic of the light projected by the light fixture, determines a first PCLED output value for the first PCLED based on the control signal, determines a first DLED output value for the first DLED based on the control signal, determines a second PCLED output value for the second PCLED based on the control signal, determines a second DLED output value for the second DLED based on the control signal, drives the first PCLED at the first PCLED output value, drives the first DLED at the first DLED output value, drives the second PCLED at the second PCLED output value, and drives the second DLED at the second DLED output value.

Embodiments described herein provide a method for driving light-emitting diodes in a light fixture to project light therefrom. The light fixture includes a first PCLED that emits light in a first PCLED wavelength range, a first DLED that emits light in a first DLED wavelength range, a second PCLED that emits light in a second PCLED wavelength range, and a second DLED that emits light in a second DLED wavelength range. The first DLED wavelength range is within the first PCLED wavelength range. The second DLED wavelength range is within the second PCLED wavelength range. The method includes determining a first PCLED output value for the first PCLED based on a target characteristic of the light projected by the light fixture, determining a first DLED output value for the first DLED based on the target characteristic of the light projected by the light fixture, determining a second PCLED output value for the second PCLED based on the target characteristic of the light projected by the light fixture, determining a second DLED output value for the second DLED based on the target characteristic of the light projected by the light fixture, driving the first PCLED at the first PCLED output value, driving the first DLED at the first DLED output value, driving the second PCLED at the second PCLED output value, and driving the second DLED at the second DLED output value.

Before any embodiments are explained in detail, it is to be understood that the embodiments are not limited in its application to the details of the configuration and arrangement of components set forth in the following description or illustrated in the accompanying drawings. The embodiments are capable of being practiced or of being carried out in various ways. Also, it is to be understood that the phraseology and terminology used herein are for the purpose of description and should not be regarded as limiting. The use of "including," "comprising," or "having" and variations thereof are meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings.

In addition, it should be understood that embodiments may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic-based aspects may be implemented in software (e.g., stored on non-transitory computer-readable medium) executable by one or more processing units, such as a microprocessor and/or application specific integrated circuits ("ASICs"). As such, it should be noted that a plurality of hardware and software based devices, as well as a plurality of different structural components, may be utilized to implement the embodiments. For example, "servers" and "computing devices" described in the specification can include one or more processing units, one or more computer-readable medium modules, one or more input/output interfaces, and various connections (e.g., a system bus) connecting the components.

Other aspects of the embodiments will become apparent by consideration of the detailed description and the accompanying drawings.

BRIEF DESCRIPTION OF THE DRAWINGS

FIG. 3A illustrates a graph of light emitted by the light fixture of FIG. 1A comparing wavelength (in nanometers) to optical power (normalized).

FIG. 6 illustrates a process for driving LEDs in any of the light fixtures of FIGS. 1A-1C, according to embodiments described herein.

DETAILED DESCRIPTION

Figure 1A:
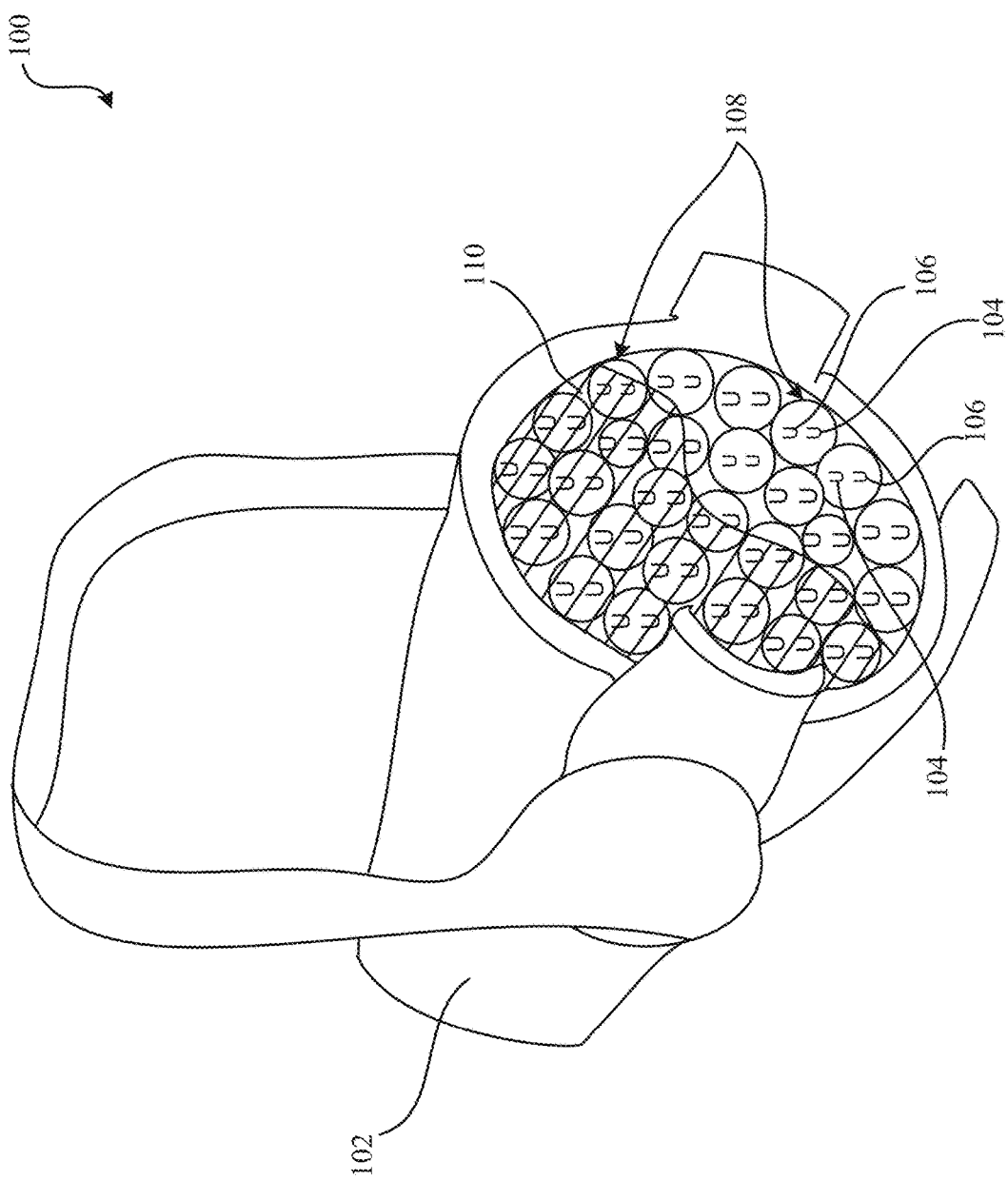
FIG. 1A illustrates a light fixture, according to embodiments described herein.

FIG. 1A illustrates a light fixture 100. The light fixture 100 includes a housing 102 with multiple light-emitting diodes ("LEDs") disposed therein. Particularly, the light fixture 100 includes phosphor-converted LEDs ("PCLEDs") 104 and direct LEDs ("DLEDs") 106. In some embodiments, the DLEDs 106 are each multicolor LEDs (e.g., multicolor chip-on-board ["COB"] LEDs). The PCLEDs 104 and the DLEDs 106 are illustrated as being positioned adjacent each other in each of the LED reflector cells 108, but other embodiments may include the PCLEDs 104 and the DLEDs 106 positioned in separate respective LED reflector cells 108. The light fixture 100 is also illustrated with a light diffuser 110 positioned over the reflector cells 108. In some embodiments, the light diffuser 110 may be omitted.

Figure 1B:
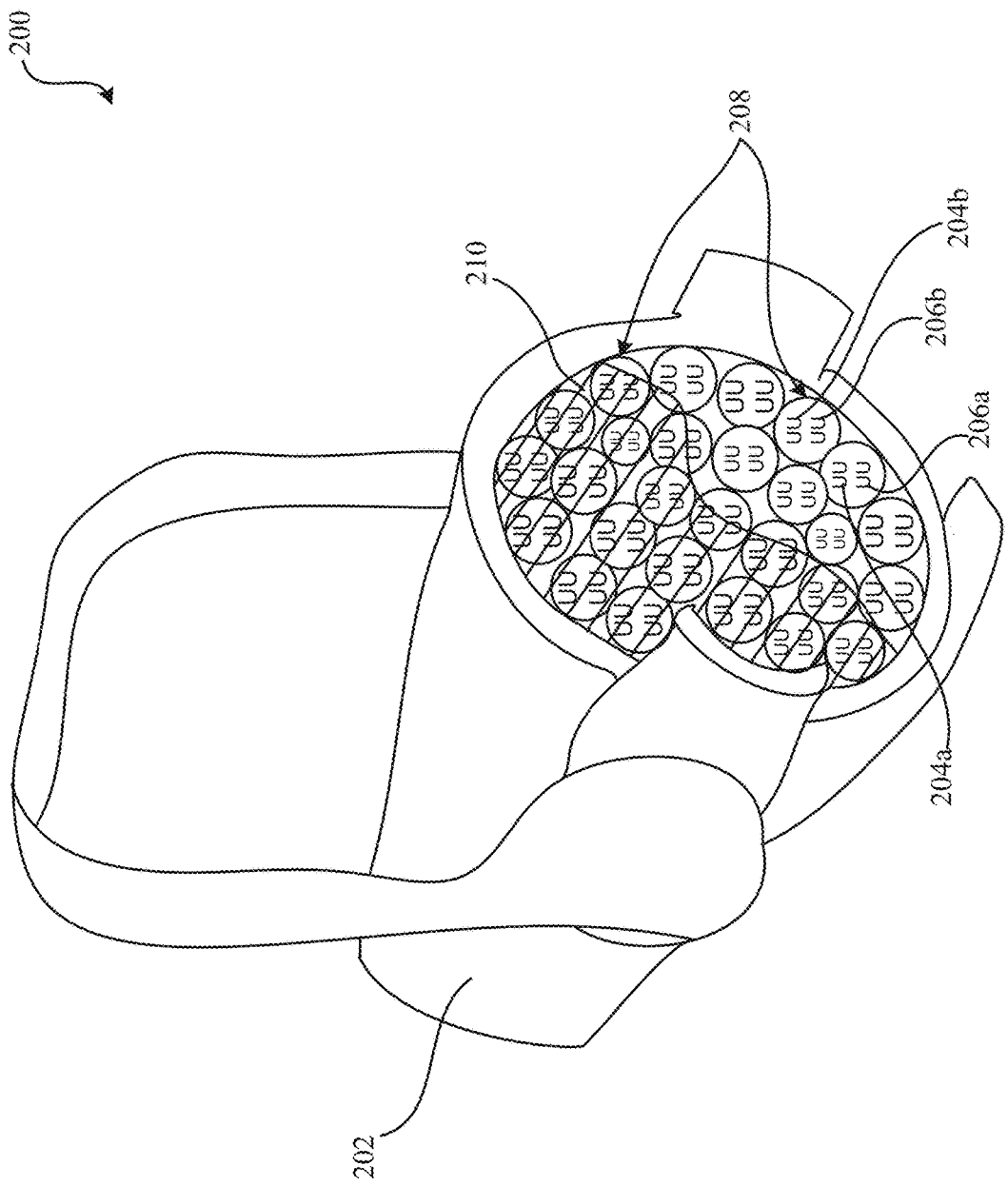
FIG. 1B illustrates another light fixture, according to embodiments described herein.

FIG. 1B illustrates another light fixture 200. The light fixture 200 is similar to the light fixture 100 above. The light fixture 200 includes a housing 202 with multiple LEDs disposed therein, including PCLEDs 204a, 204b and DLEDs 206a, 206b. The PCLEDs 204a, 204b and the DLEDs 206a, 206b are illustrated as being positioned adjacent each other in each of the LED reflector cells 208, but they may be in separate LED reflector cells 208. An optional light diffuser 210 is also illustrated as part of the light fixture 200.

Figure 1C:
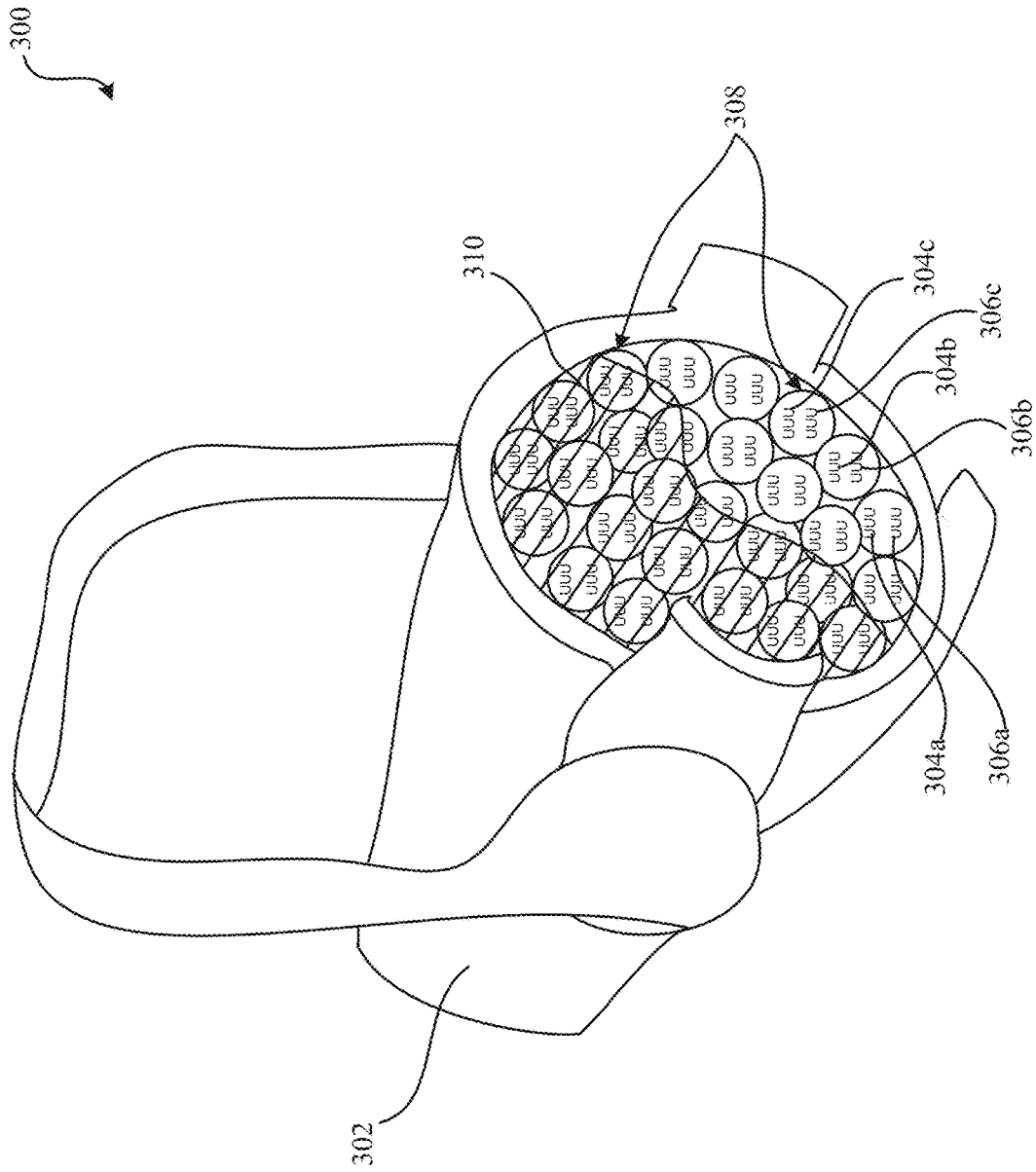
FIG. 1C illustrates yet another light fixture, according to embodiments described herein.

FIG. 1C illustrates yet another light fixture 300. The light fixture 300 is similar to the light fixture 100 above. The light fixture 300 includes a housing 302 with multiple LEDs disposed therein, including PCLEDs 304a, 304b, 304c and DLEDs 306*a*, 306*b*, 306*c*. The PCLEDs 304*a*, 304*b*, 304*c* and the DLEDs 306*a*, 306*b*, 306*c* are illustrated as being positioned adjacent each other in each of the LED reflector cells 308, but they may be in separate LED reflector cells 308. An optional light diffuser 310 is also illustrated as part of the light fixture 300.

Figure 2A:
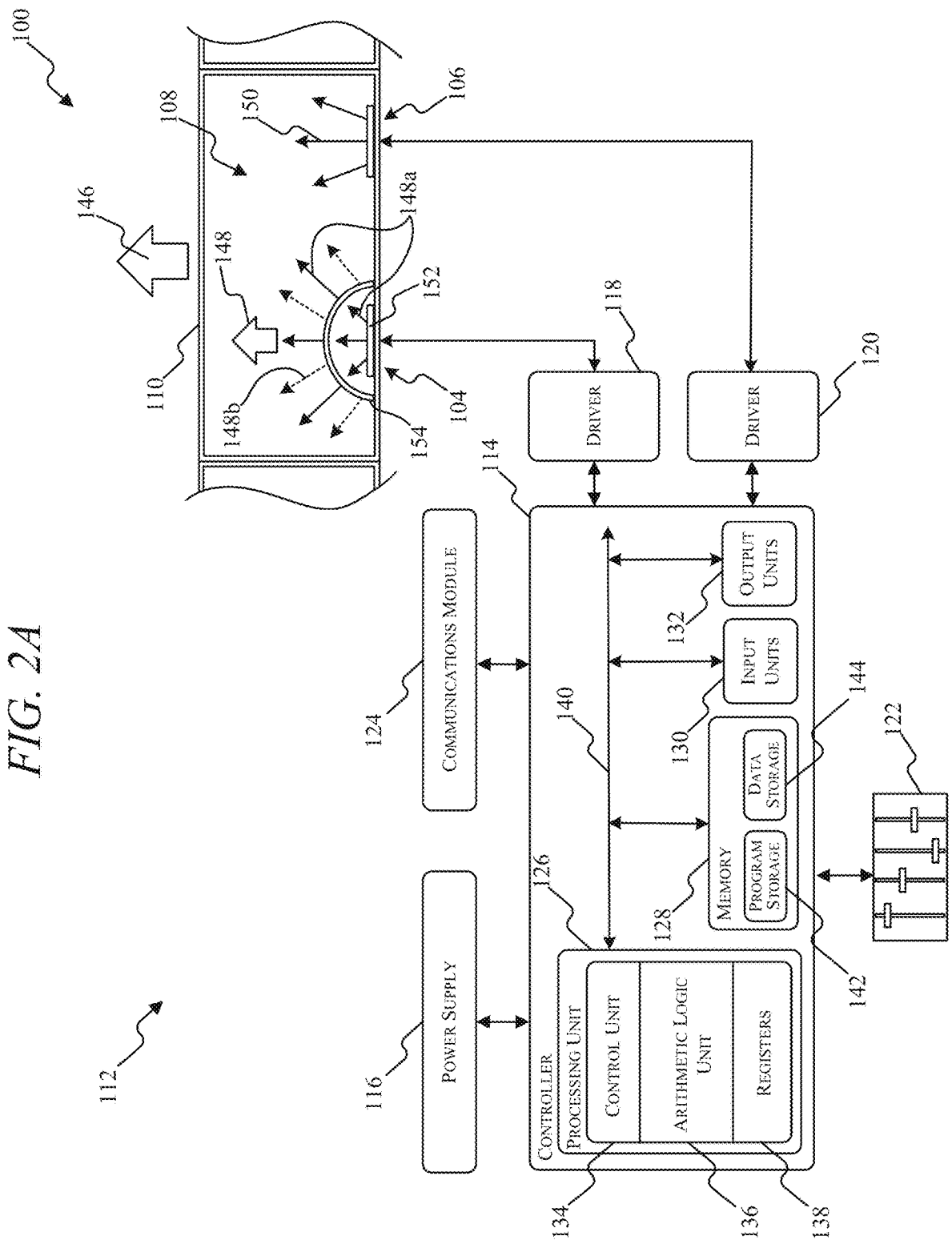
FIG. 2A schematically illustrates a lighting system including the light fixture of FIG. 1A, according to embodiments described herein.

With reference to FIG. 2A, the light fixture 100 is shown schematically as part of a lighting system 112. The lighting system 112 includes a controller 114 associated with the lighting system 112 and electrically and/or communicatively connected to a variety of modules or components of the lighting system 112. For example, the illustrated controller 114 is connected to, among other things, the PCLEDs 104, the DLEDs 106, a power supply module 116, a PCLED driver 118, a DLED driver 120, a user interface such as a lighting console 122, and a communications module 124. The controller 114 includes combinations of hardware and software that are operable to, among other things, control the operation of the lighting system 112, an output of the PCLEDs 104 and the DLEDs 106, information displayed in the lighting console 122, or the like.

The controller 114 includes a plurality of electrical and electronic components that provide power, operational control, and protection to the components and modules within the controller 114 and/or the lighting system 112. For example, the controller 114 includes, among other things, a processing unit 126 (e.g., a microprocessor, a microcontroller, or another suitable programmable device), a memory 128, input units 130, and output units 132. The processing unit 126 includes, among other things, a control unit 134, an arithmetic logic unit ("ALU") 136, and a plurality of registers 138 (shown as a group of registers in FIG. 2A), and is implemented using a known computer architecture, such as a modified Harvard architecture, a von Neumann architecture, etc. The processing unit 126, the memory 128, the input units 130, and the output units 132, as well as the various modules connected to the controller 114 are connected by one or more control and/or data buses (e.g., common bus 140). The control and/or data buses are shown generally in FIG. 2A for illustrative purposes. The use of one or more control and/or data buses for the interconnection between and communication among the various modules and components would be known to a person skilled in the art in view of the present disclosure.

The memory 128 is a non-transitory computer readable medium and includes, for example, a program storage area 142 and a data storage area 144. The program storage area 142 and the data storage area 144 can include combinations of different types of memory, such as read-only memory ("ROM"), random access memory ("RAM") (e.g., dynamic RAM ["DRAM"], synchronous DRAM ["SDRAM"], etc.), electrically erasable programmable read-only memory ("EEPROM"), flash memory, a hard disk, an SD card, or other suitable magnetic, optical, physical, or electronic memory devices. The processing unit 126 is connected to the memory 128 and executes software instructions that are capable of being stored in a RAM of the memory 128 (e.g., during execution), a ROM of the memory 128 (e.g., on a generally permanent basis), or another non-transitory computer readable medium such as another memory or a disc. Software included in the implementation of the lighting system 112 can be stored in the memory 128 of the controller 114. The software includes, for example, firmware, one or more applications, program data, filters, rules, one or more program modules, and other executable instructions. The controller 114 is configured to retrieve from memory and execute, among other things, instructions related to the control processes and methods described herein. In other embodiments, the controller 114 includes additional, fewer, or different components.

The power supply module 116 supplies a nominal AC or DC voltage to the controller 114 or other components or modules of the lighting system 112. The power supply module 116 is powered by, for example, a power source having nominal line voltages between 100V and 240V AC and frequencies of approximately 50-60 Hz. The power supply module 116 is also configured to supply lower voltages to operate circuits and components within the controller 114 or lighting system 112. In other embodiments, the controller 114 or other components and modules within the lighting system 112 are powered by one or more batteries or battery packs, or another grid-independent power source (e.g., a generator, a solar panel, etc.).

The lighting console 122 is used to control and/or monitor the lighting system 112. For example, the lighting console 122 is operably coupled to the controller 114 to control the color output of the light fixture 100. In some embodiments, the lighting console 122 includes a combination of digital and analog input or output devices required to achieve a desired level of control and/or monitoring for the lighting system 112. For example, the lighting console 122 includes a display (e.g., a monitor) and input devices such as touch-screen displays, a plurality of knobs, dials, switches, buttons, etc. The display is, for example, a liquid crystal display ("LCD"), an LED display, an organic LED ("OLED") display, etc. The lighting console 122 can also be configured to display conditions or data associated with the lighting system 112 in real-time or substantially real-time. For example, the lighting console 122 is configured to display characteristics or properties of the lighting system 112, the status of the lighting system 112, the output of the light fixture 100, etc. In some implementations, the lighting console 122 is controlled to provide visual or auditory indications of the status or conditions of the lighting system 112. The lighting console 122 is further configured to generate a control signal corresponding to a target characteristic of the light 146 projected by the light fixture 100 (e.g., brightness, overall color, illumination duration, or the like). The controller 114 is configured to receive the control signal from the lighting console 122, determine output values for the PCLED and the DLED respectively, and drive the PCLED and the DLED at the respective output values.

The PCLED driver 118 provides drive signals to the PCLED 104, and the DLED driver 120 provides drive signals to the DLED 106. In some embodiments, both the PCLED driver 118 and the DLED driver 120 are configured to generate multiple drive signals to drive multiple groups of LEDs.

With continued reference to FIG. 2A, light 146 is projected from the light fixture 100. The light 146 is a combination of the light 148 emitted from the PCLED 104 and the light 150 emitted from the DLED 106. The light diffuser 110 promotes the combination of the light 148 from the PCLED 104 and the light 150 from the DLED 106.

The PCLED 104 includes an LED 152. The LED 152 is configured to emit light 148*a* in a narrow band relative to the light 148 emitted from the PCLED 104. In some embodiments, the light 148*a* falls on the electromagnetic spectrum in a range associated with a blue LED. Other embodiments include the light 148*a* corresponding to ultraviolet light or a visible color other than blue.

The PCLED 104 further includes a phosphor layer 154. The phosphor layer 154 covers the LED 152. In some embodiments, the phosphor layer 154 is deposited directly on a surface of the LED 152. In other embodiments, the phosphor layer 154 is formed as a structure connected to the housing 102 (shown in FIG. 1A) or to the LED reflector cell 108 and at least partially surrounding the LED 152 with the housing 102 or the LED reflector cell 108 (such as, for instance, a remote phosphor). The phosphor layer 154 absorbs light 148a emitted from the LED 152. The absorbed light is then emitted from the phosphor layer 154 in the form of light 148b. In some embodiments, the light 148b falls on the electromagnetic spectrum in a range associated with yellow light. Other embodiments include the light 148b corresponding to orange light, red light, green light, blue light, or the like.

In the illustrated embodiment, the phosphor layer 154 includes areas of light permeability such that not all of the light 148a emitted from the LED 152 is absorbed by the phosphor layer 154. In such embodiments, the light 148a emitted from the LED 152 that passes through the phosphor layer 154 combines with the light 148b emitted from the phosphor layer 154. This combination forms the light 148 output from the PCLED 104. Other embodiments include all the light 148a from the LED 152 being absorbed by the phosphor layer 154 such that the light 148 emitted by the PCLED 104 beyond the phosphor layer 154 includes only the light 148b emitted from the phosphor layer 154.

In some embodiments, the light 148 (a combination of 148a and 148b) emitted by the PCLED 104 is perceived by the human eye as white light due to the combination of the light 148a (e.g., as blue light) emitted by the LED 152 and the light 148b (e.g., as yellow light) emitted by the phosphor layer 154. In other embodiments, the light 148 emitted by the PCLED 104 can have a broadband range on the electromagnetic spectrum that is centered on a wavelength that corresponds to a particular color of light. For instance, the light 148 emitted by the PCLED 104 can correspond to yellow light, orange light, red light, green light, blue light, or the like.

The light fixture 100 further includes the DLED 106 disposed in the housing 102. The DLED 106 has no phosphor layer and instead emits light 150 directly outward toward the light diffuser 110. The light 150 emitted from the DLED 106 falls on the electromagnetic spectrum in a relatively narrow band compared to the light 148 emitted from the PCLED 104. The DLED 106 can be configured to emit light 150 in a narrow band on the electromagnetic spectrum corresponding to only one color, such as yellow, orange, red, green, blue, or the like.

Figure 2B:
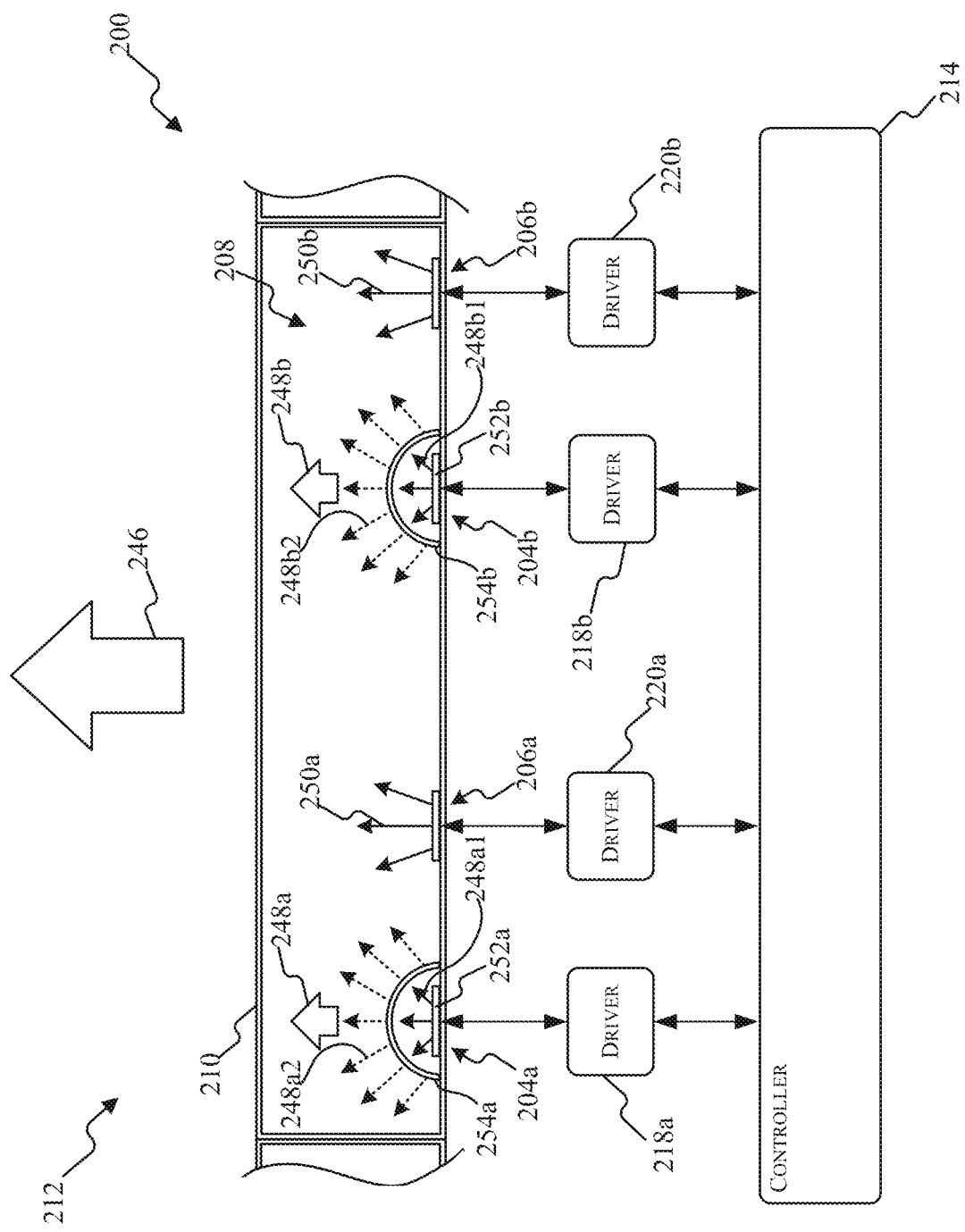
FIG. 2B schematically illustrates a lighting system including the light fixture of FIG. 1B, according to embodiments described herein.

With reference to FIG. 2B, the light fixture 200 is shown schematically as part of another embodiment of a lighting system 212. The lighting system 212 is similar to the lighting system 112 described above. Many of the components of the lighting system 212 are not shown, but reference can be made to FIG. 2A for more detail regarding these components.

With continued reference to FIG. 2B, the lighting system 212 includes two PCLEDs 204a, 204b of different colors and two DLEDs 206a, 206b of different colors. The lighting system 212 includes a controller 214 associated with the lighting system 212 and electrically and/or communicatively connected to a variety of modules or components of the lighting system 212 (not all of which are shown). For example, the illustrated controller 214 is connected to, among other things, the PCLEDs 204a, 204b, the DLEDs 206a, 206b, PCLED drivers 218a, 218b, and DLED drivers 220a, 220b. The controller 214 includes combinations of hardware and software that are operable to, among other things, control the operation of the lighting system 212, an output of the PCLEDs 204a, 204b and the DLEDs 206a, 206b, or the like.

With continued reference to FIG. 2B, light 246 is projected from the light fixture 200. The light 246 is any combination of the light 248a emitted from the first PCLED 204a, the light 248b emitted from the second PCLED 204b, the light 250a emitted from the first DLED 206a, and the light 250b emitted from the second DLED 206b. The light diffuser 210 promotes the combination of the light 248a, 248b, 250a, 250b.

The first PCLED 204a projects light 248a of any color, such as blue light, for instance. The first PCLED 204a includes a first LED 252a. The first LED 252a is configured to emit light 248a1 in a narrow band relative to the light 248a emitted from the first PCLED 204a.

The first PCLED 204a further includes a first phosphor layer 254a. The first phosphor layer 254a covers the first LED 252a. In some embodiments, the first phosphor layer 254a is deposited directly on a surface of the first LED 252a. Other embodiments include the first phosphor layer 254a formed as a structure at least partially surrounding the first LED 252a. The first phosphor layer 254a absorbs light 248a1 emitted from the first LED 252a. The absorbed light is then emitted from the first phosphor layer 254a in the form of light 248a2. In some embodiments, the light 248a2 falls on the electromagnetic spectrum in a range associated with blue light.

In the illustrated embodiment in FIG. 2B, the first phosphor layer 254a absorbs a majority of the light 248a1 emitted from the first LED 252a. In some embodiments, the phosphor layer 254a allows none of the light 248a1, or substantially none of the light 248a1, to pass through the phosphor layer 254a. In such embodiments, the light 248a2 emitted by the phosphor layer 254a is the same light as the light 248a emitted generally by the PCLED 204a. Other embodiments may include the phosphor layer 254a having areas of light permeability such that not all of the light 248a1 emitted from the first LED 252a is absorbed by the phosphor layer 254a.

The second PCLED 204b projects light 248b of a color that is different from the color of the light 248a projected by the first PCLED 204a. The color of the light 248b projected by the second PCLED 204b may be green, for instance. The second PCLED 204b includes a second LED 252b. The second LED 252b is configured to emit light 248b1 in a narrow band relative to the light 248b emitted from the second PCLED 204b.

The second PCLED 204b is largely similar to the first PCLED 204a, aside from the color of the light 248b the second PCLED 204b is configured to project. The second PCLED 204b includes a phosphor layer 254b that absorbs light 248b1 emitted from the second LED 252b that is then emitted from the phosphor layer 254b in the form of light 248b2. In some embodiments, the light 248b2 falls on the electromagnetic spectrum in a range associated with green light.

In the illustrated embodiment in FIG. 2B, the phosphor layer 254b absorbs a majority of the light 248b1 emitted from the second LED 252b. In some embodiments, the phosphor layer 254b allows none of the light 248b1, or substantially none of the light 248b1, to pass through the phosphor layer 254b. In such embodiments, the light 248b2 emitted by the phosphor layer 254b is the same light as the light 248b emitted generally by the second PCLED 204b. Other embodiments may include the phosphor layer 254b having areas of light permeability such that not all of the light 248*b*1 emitted from the second LED 252*b* is absorbed by the phosphor layer 254*b*.

The light fixture 200 further includes a first DLED (or a third LED) 206*a* and a second DLED (or a fourth LED) 206*b* disposed in the housing 202. The DLEDs 206*a*, 206*b* have no phosphor layer and instead emit light 250*a*, 250*b* (respectively) directly outward toward the light diffuser 210. The light 250*a*, 250*b* emitted from the respective DLED 206*a*, 206*b* falls on the electromagnetic spectrum in a relatively narrow band compared to the light 248*a*, 248*b* emitted from the respective PCLED 204*a*, 204*b*. The first DLED 206*a* can be configured to emit light 250*a* corresponding to the color blue, for instance, and the second DLED 206*b* can be configured to emit light 250*b* corresponding to another color, such as green, for instance.

Figure 2C:
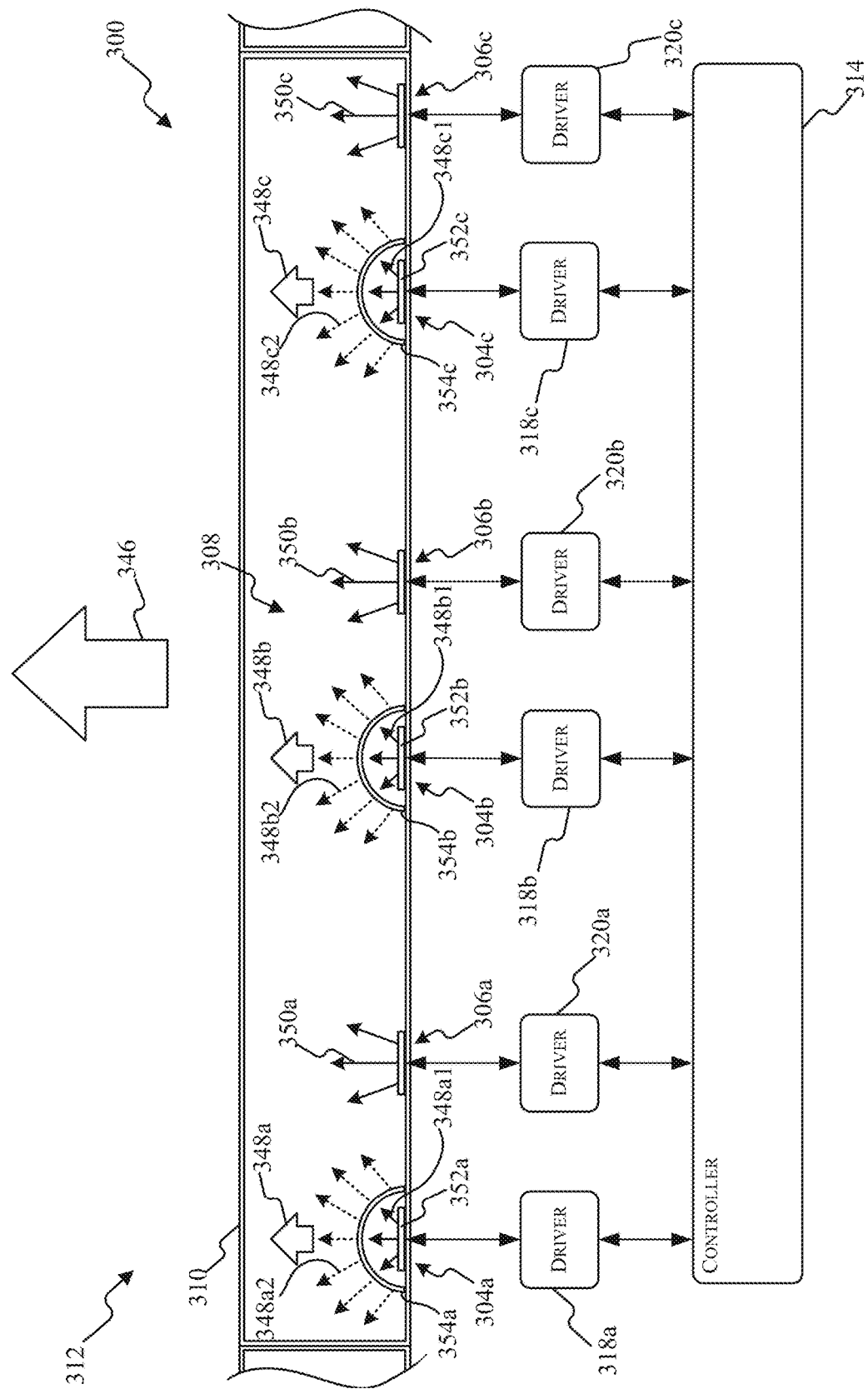
FIG. 2C schematically illustrates a lighting system including the light fixture of FIG. 1C, according to embodiments described herein.

With reference to FIG. 2C, the light fixture 300 is shown schematically as part of yet another embodiment of a lighting system 312. The lighting system 312 is similar to the lighting system 112 described above. Many of the components of the lighting system 312 are not shown, but reference can be made to FIG. 2A for more detail regarding these components.

With continued reference to FIG. 2C, the lighting system 312 includes three PCLEDs 304*a*, 304*b*, 304*c* of different colors and three DLEDs 306*a*, 306*b*, 306*c* of different colors. The lighting system 312 includes a controller 314 associated with the lighting system 312 and electrically and/or communicatively connected to a variety of modules or components of the lighting system 312 (not all of which are shown). For example, the illustrated controller 314 is connected to, among other things, the PCLEDs 304*a*, 304*b*, 304*c*, the DLEDs 306*a*, 306*b*, 306*c*, PCLED drivers 318*a*, 318*b*, 318*c*, and DLED drivers 320*a*, 320*b*, 320*c*. The controller 314 includes combinations of hardware and software that are operable to, among other things, control the operation of the lighting system 312, an output of the PCLEDs 304*a*, 304*b*, 304*c* and the DLEDs 306*a*, 306*b*, 306*c*, or the like.

With continued reference to FIG. 2C, light 346 is projected from the light fixture 300. The light 346 is any combination of the light 348*a* emitted from the first PCLED 304*a*, the light 348*b* emitted from the second PCLED 304*b*, the light 348*c* emitted from the third PCLED 304*c*, the light 350*a* emitted from the first DLED 306*a*, the light 350*b* emitted from the second DLED 306*b*, and the light 350*c* emitted from the third DLED 306*c*. The light diffuser 310 promotes the combination of the light 348*a*, 348*b*, 348*c*, 350*a*, 350*b*, 350*c*.

The first PCLED 304*a* projects light 348*a* of any color, such as blue light, for instance. The first PCLED 304*a* includes a first LED 352*a*. The first LED 352*a* is configured to emit light 348*a*1 in a narrow band relative to the light 348*a* emitted from the first PCLED 304*a*.

The first PCLED 304*a* further includes a phosphor layer 354*a* covering the first LED 352*a* as described above. The phosphor layer 354*a* absorbs light 348*a*1 emitted from the first LED 352*a*. The absorbed light is then emitted from the phosphor layer 354*a* in the form of light 348*a*2. In some embodiments, the light 348*a*2 falls on the electromagnetic spectrum in a range associated with blue light.

In the illustrated embodiment in FIG. 2C, the phosphor layer 354*a* allows none of the light 348*a*1, or substantially none of the light 348*a*1, to pass through the phosphor layer 354*a*. In such embodiments, the light 348*a*2 emitted by the phosphor layer 354*a* is the same light as the light 348*a* emitted generally by the PCLED 304*a*. Other embodiments may include the phosphor layer 354*a* having areas of light permeability such that not all of the light 348*a*1 emitted from the first LED 352*a* is absorbed by the phosphor layer 354*a*.

The second PCLED 304*b* projects light 348*b* of a color that is different from the color of the light 348*a* projected by the first PCLED 304*a*. The color of the light 348*b* projected by the second PCLED 304*b* may be green, for instance. The second PCLED 304*b* includes a second LED 352*b*. The second LED 352*b* is configured to emit light 348*b*1 in a narrow band relative to the light 348*b* emitted from the second PCLED 304*b*.

The second PCLED 304*b* is largely similar to the first PCLED 304*a*, aside from the color of the light 348*b* the second PCLED 304*b* is configured to project. The second PCLED 304*b* includes a phosphor layer 354*b* that absorbs light 348*b*1 emitted from the second LED 352*b* that is then emitted from the phosphor layer 354*b* in the form of light 348*b*2. In some embodiments, the light 348*b*2 falls on the electromagnetic spectrum in a range associated with green light.

In the illustrated embodiment in FIG. 2C, the phosphor layer 354*b* allows none of the light 348*b*1, or substantially none of the light 348*b*1, to pass through the phosphor layer 354*b*. In such embodiments, the light 348*b*2 emitted by the phosphor layer 354*b* is the same light as the light 348*b* emitted generally by the second PCLED 304*b*. Other embodiments may include the phosphor layer 354*b* having areas of light permeability such that not all of the light 348*b*1 emitted from the second LED 352*b* is absorbed by the phosphor layer 354*b*.

The third PCLED 304*c* projects light 348*c* of a color that is different from the color of the light 348*a*, 348*b* projected by the respective first PCLED 304*a* and second PCLED 304*b*. The color of the light 348*c* projected by the third PCLED 304*c* may be red, for instance. The third PCLED 304*c* includes a fifth LED 352*c*. The fifth LED 352*c* is configured to emit light 348*c*1 in a narrow band relative to the light 348*c* emitted from the third PCLED 304*c*.

The third PCLED 304*c* is largely similar to the first PCLED 304*a* and the second PCLED 304*b*, aside from the color of light 348*c* the third PCLED 304*c* is configured to project. The third PCLED 304*c* includes a phosphor layer 354*c* that absorbs light 348*c*1 emitted from the third LED 352*c* that is then emitted from the phosphor layer 354*c* in the form of light 348*c*2. In some embodiments, the light 348*c*2 falls on the electromagnetic spectrum in a range associated with red light.

In the illustrated embodiment in FIG. 2C, the phosphor layer 354*c* allows none of the light 348*c*1, or substantially none of the light 348*c*1, to pass through the phosphor layer 354*c*. In such embodiments, the light 348*c*2 emitted by the phosphor layer 354*c* is the same light as the light 348*c* emitted generally by the third PCLED 304*c*. Other embodiments may include the phosphor layer 354*c* having areas of light permeability such that not all of the light 348*c*1 emitted from the third LED 352*c* is absorbed by the phosphor layer 354*c*.

The light fixture 300 further includes a first DLED (or third LED) 306*a*, a second DLED (or fourth LED) 306*b*, and a third DLED (or sixth LED) 306*c* disposed in the housing 302. The DLEDs 306*a*, 306*b*, 306*c* have no phosphor layer and instead emit light 350*a*, 350*b*, 350*c* (respectively) directly outward toward the light diffuser 310. The light 350*a*, 350*b*, 350*c* emitted from the respective DLED 306*a*, 306*b*, 306*c* falls on the electromagnetic spectrum in a relatively narrow band compared to the light 348*a*, 348*b*, 348*c* emitted from the respective PCLED 304*a*, 304*b*, 304*c*.

The first DLED 306*a* can be configured to emit light 350*a* corresponding to the color blue, for instance. The second DLED 306*b* can be configured to emit light 350*b* corresponding to another color, such as green, for instance. The third DLED 306*c* can be configured to emit light 350*c* corresponding to yet another color, such as red, for instance.

With reference to FIG. 3A, a line graph representing an exemplary embodiment of the light 148*a* from the LED 152 of the PCLED 104, the light 148*b* from the phosphor layer 154 of the PCLED 104, and the light 150 from the DLED 106 on the electromagnetic spectrum is shown. In the illustrated embodiment, the light 148 emitted by the PCLED 104 includes blue light 148*a* emitted from the LED 152 that passes through the phosphor layer 154 and yellow light 148*b* emitted from the phosphor layer 154. The light 150 emitted by the DLED 106 includes green light in the embodiment illustrated in FIG. 3A.

As shown in FIG. 3A, the light 148 (a combination of 148*a* and 148*b*) from the PCLED 104 is emitted in a first wavelength range (or a PCLED wavelength range) R1, and the light 150 from the DLED 106 is emitted in a second wavelength range (or a DLED wavelength range) R2. The first wavelength range R1 includes a first upper bound UB1 and a first lower bound LB1. The second wavelength range R2 includes a second upper bound UB2 and a second lower bound LB2. The first upper bound UB1, the first lower bound LB1, the second upper bound UB2, and the second lower bound LB2 are not necessarily wavelength values on the electromagnetic spectrum beyond which no light is emitted from the respective LED 104, 106.

Instead, in some embodiments, the first upper bound UB1 and the first lower bound LB1 represent respective wavelength values beyond which lies only light 148 (148*a* and 148*b*) that has an intensity value that is less than 10% of the peak intensity value of the light 148. In other embodiments, the intensity value is less than 5% of the peak intensity value of the light 148. In still other embodiments, the intensity value is less than 1% of the peak intensity value of the light 148. Stated another way, some embodiments include the first wavelength range R1 having only light 148 (148*a* and 148*b*) that has an intensity value that is greater than 1% of the peak intensity value of the light 148. Other embodiments include the first wavelength range R1 having only light 148 that has an intensity value that is greater than 5% of the peak intensity value of the light 148. Still other embodiments include the first wavelength range R1 having only light 148 that has an intensity value that is greater than 10% of the peak intensity value of the light 148.

Similarly, in some embodiments, the second upper bound UB2 and the second lower bound LB2 represent respective wavelength values beyond which lies only light 150 that has an intensity value that is less than 10% of the peak intensity value of the light 150. In other embodiments, the intensity value is less than 5% of the peak intensity value of the light 150. In still other embodiments, the intensity value is less than 1% of the peak intensity value of the light 150. Stated another way, some embodiments include the second wavelength range R2 having only light 150 that has an intensity value that is greater than 1% of the peak intensity value of the light 150. Other embodiments include the second wavelength range R2 having only light 150 that has an intensity value that is greater than 5% of the peak intensity value of the light 150. Still other embodiments include the second wavelength range R2 having only light 150 that has an intensity value that is greater than 10% of the peak intensity value of the light 150.

In the illustrated embodiment in FIG. 3A, the PCLED wavelength range R1 has a PCLED upper bound UB1 (e.g., approximately 660 nm) that has a wavelength of a higher value than the DLED upper bound UB2 (e.g., approximately 575 nm) of the DLED wavelength range R2. The PCLED wavelength range R1 also has a PCLED lower bound LB1 (e.g., approximately 400 nm) that has a wavelength of a lower value than the DLED lower bound LB2 (e.g., approximately 430 nm) of the DLED wavelength range R2. Stated another way, the DLED wavelength range R2 falls along the electromagnetic spectrum completely within the PCLED wavelength range R1.

The light 148 from the PCLED 104 further includes a median PCLED wavelength M1, and the light 150 from the DLED 106 includes a median DLED wavelength M2. In some embodiments, the median PCLED wavelength M1 and the median DLED wavelength M2 are within 50 nanometers of each other. In other embodiments, the median PCLED wavelength M1 and the median DLED wavelength M2 are within 25 nanometers of each other. In still other embodiments, the median PCLED wavelength M1 and the median DLED wavelength M2 are within 10 nanometers of each other. In still other embodiments, the median PCLED wavelength M1 and the median DLED wavelength M2 are the same wavelength value. Even more embodiments include the median PCLED wavelength M1 and the median DLED wavelength M2 being within 50-100 nanometers of each other, within 100-200 nanometers of each other, and more than 200 nanometers away from each other.

In some embodiments, the target characteristic of the light 146 projected by the light fixture 100 includes a PCLED wavelength range intensity and a DLED wavelength range intensity combining at a target ratio. In the illustrated embodiment in FIG. 3A, the yellow light 148*b* emitted from the phosphor layer 154 of the PCLED 104 combines with the green light 150 emitted from the DLED 106 at a target ratio. In some embodiments, the target ratio includes the DLED wavelength range intensity being at least two times greater than the PCLED wavelength range intensity. In FIG. 3A, the green light 150 is more than two times greater in intensity (along the Y-axis labeled optical power) than the yellow light 148*b* (e.g., the green light 150 outputs 60 lumens while the yellow light 148*b* outputs 30 lumens). In some embodiments, the intensity of the light 150 emitted from the DLED 106 is at least three times greater than the intensity of the light 148*b* emitted from the phosphor layer 154 of the PCLED 104 (e.g., the green light 150 outputs 90 lumens while the yellow light 148*b* outputs 30 lumens). In some embodiments, the intensity of the light 150 emitted from the DLED 106 is at least four times greater than the intensity of the light 148*b* emitted from the phosphor layer 154 of the PCLED 104 (e.g., the green light 150 outputs 120 lumens while the yellow light 148*b* outputs 30 lumens).

In some embodiments, the target characteristic of the light 146 projected by the light fixture 100 includes a target wavelength range to correspond to a specific color or temperature of light (e.g., 400-660 nm, 430-660 nm, or the like). The light 146 projected by the light fixture 100 is limited to, for example, the target wavelength range under control of the lighting console 122. Stated another way, the color of the light 146 can be controlled by illuminating the PCLED 104 and/or the DLED 106 at various intensities. For an example light color, only the DLED 106 is illuminated. For another example light color, only the PCLED 104 is illuminated. For still another example light color, the PCLED 104 and the DLED 106 are both illuminated at respective intensities.

Figure 3B:
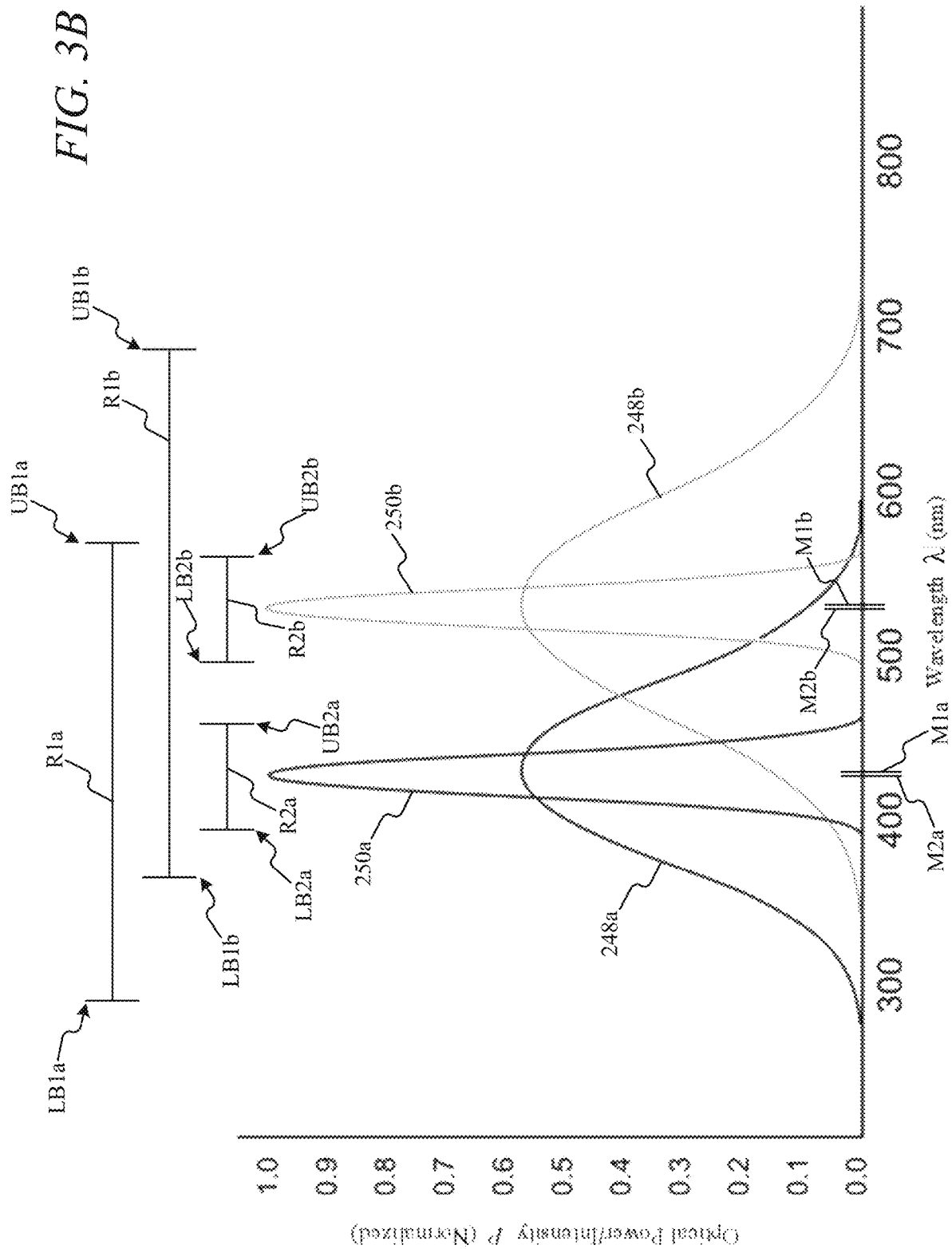
FIG. 3B illustrates a graph of light emitted by the light fixture of FIG. 1B comparing wavelength (in nanometers) to optical power (normalized).

With reference to FIG. 3B, a line graph representing an exemplary embodiment of the light 248a from the first PCLED 204a, the light 248b from the second PCLED 204b, the light 250a from the first DLED 206a, and the light 250b from the second DLED 206b on the electromagnetic spectrum is shown. In the illustrated embodiment, the light 248a emitted by the first PCLED 204a includes generally blue light, the light 248b emitted by the second PCLED 204b includes generally green light, the light 250a emitted by the first DLED 206a includes blue light, and the light 250b emitted by the second DLED 206b includes green light.

As shown in FIG. 3B, the light 248a from the first PCLED 204a is emitted in a first PCLED wavelength range R1a that includes a first PCLED upper bound UB1a and a first PCLED lower bound LB1a. The light 248b from the second PCLED 204b is emitted in a second PCLED wavelength range R1b that includes a second PCLED upper bound UB1b and a second PCLED lower bound LB1b. The light 250a from the first DLED 206a is emitted in a first DLED wavelength range R2a that includes a first DLED upper bound UB2a and a first DLED lower bound LB2a. The light 250b from the second DLED 206b is emitted in a second DLED wavelength range R2b that includes a second DLED upper bound UB2b and a second DLED lower bound LB2b. The bounds UB1a, UB1b, LB1a, LB1b, UB2a, UB2b, LB2a, LB2b are not necessarily wavelength values on the electromagnetic spectrum beyond which no light is emitted from the respective LED 204a, 204b, 206a, 206b.

Instead, in some embodiments, each of the bounds UB1a and LB1a, UB1b and LB1b, UB2a and LB2a, UB2b and LB2b represents a respective wavelength value beyond which lies only light 248a, 248b, 250a, 250b (respectively) that has an intensity value that is less than 10% of the peak intensity value of the respective light. In other embodiments, the intensity value is less than 5% of the peak intensity value. In still other embodiments, the intensity value is less than 1% of the peak intensity value. Stated another way, some embodiments include each wavelength range R1a, R1b, R2a, R2b having only light 248a, 248b, 250a, 250b (respectively) that has an intensity value that is greater than 1% of the peak intensity value of the respective light. Other embodiments include each wavelength range R1a, R1b, R2a, R2b having only light 248a, 248b, 250a, 250b (respectively) that has an intensity value that is greater than 5% of the peak intensity value. Still other embodiments include each wavelength range R1a, R1b, R2a, R2b having only light 248a, 248b, 250a, 250b (respectively) that has an intensity value that is greater than 10% of the peak intensity value.

In the illustrated embodiment in FIG. 3B, the first PCLED wavelength range R1a has a first PCLED upper bound UB1a (e.g., approximately 570 nm) that has a wavelength of a higher value than the first DLED upper bound UB2a (e.g., approximately 450 nm) of the first DLED wavelength range R2a. The first PCLED wavelength range R1a also has a first PCLED lower bound LB1a (e.g., Approximately 300 nm) that has a Wavelength of a Lower Value than the First DLED lower bound LB2a (e.g., approximately 390 nm) of the first DLED wavelength range R2a. Stated another way, the first DLED wavelength range R2a falls along the electromagnetic spectrum completely within the first PCLED wavelength range R1a.

The second PCLED wavelength range R1b has a second PCLED upper bound UB1b (e.g., approximately 690 nm) that has a wavelength of a higher value than the second DLED upper bound UB2b (e.g., approximately 560 nm) of the second DLED wavelength range R2b. The second PCLED wavelength range R1b also has a second PCLED lower bound LB1b (e.g., approximately 350 nm) that has a wavelength of a lower value than the second DLED lower bound LB2b (e.g., approximately 500 nm) of the second DLED wavelength range R2b. Stated another way, the second DLED wavelength range R2b falls along the electromagnetic spectrum completely within the second PCLED wavelength range R1b.

The light 248a from the first PCLED 204a further includes a median first PCLED wavelength M1a, and the light 250a from the first DLED 206a includes a median first DLED wavelength M2a. The light 248b from the second PCLED 204b further includes a median second PCLED wavelength M1b, and the light 250b from the second DLED 206b includes a median second DLED wavelength M2b. In some embodiments, the median first PCLED wavelength M1a and the median first DLED wavelength M2a are within 50 nanometers of each other, and the median second PCLED wavelength M1b and the median second DLED wavelength M2b are within 50 nanometers of each other. In other embodiments, the median first PCLED wavelength M1a and the median first DLED wavelength M2a are within 25 nanometers of each other, and the median second PCLED wavelength M1b and the median second DLED wavelength M2b are within 25 nanometers of each other. In still other embodiments, the median first PCLED wavelength M1a and the median first DLED wavelength M2a are within 10 nanometers of each other, and the median second PCLED wavelength M1b and the median second DLED wavelength M2b are within 10 nanometers of each other. In still other embodiments, the median first PCLED wavelength M1a and the median first DLED wavelength M2a are the same wavelength value, and the median second PCLED wavelength M1b and the median second DLED wavelength M2b are the same value. Even more embodiments include the median first PCLED wavelength M1a and the median first DLED wavelength M2a being within 50-100 nanometers of each other, within 100-200 nanometers of each other, and more than 200 nanometers away from each other, and the embodiments include the median second PCLED wavelength M1b and the median second DLED wavelength M2b being within 50-100 nanometers away from each other, within 100-200 nanometers of each other, and more than 200 nanometers away from each other.

In some embodiments, the target characteristic of the light 246 projected by the light fixture 200 includes a first PCLED wavelength range intensity and a first DLED wavelength range intensity combining at a target ratio. In the illustrated embodiment in FIG. 3B, the blue light 248a emitted from the first PCLED 204a combines with the blue light 250a emitted from the first DLED 206a at a target ratio and the green light 248b emitted from the second PCLED 204b combines with the green light 250b emitted from the second DLED 206b at a target ratio. In some embodiments, the target ratio includes each of the DLED wavelength range intensities being at least two times greater than the respective PCLED wavelength range intensity (e.g., each light 250a, 250b outputs 60 lumens while each light 248a, 248b outputs 30 lumens). In some embodiments, each DLED wavelength range intensity is at least three times greater in intensity (along the Y-axis labeled optical power) than the respective PCLED wavelength range intensity (e.g., each light 250a, 250b outputs 90 lumens while each light 248a, 248b outputs 30 lumens). In some embodiments, each DLED wavelength range intensity is at least four times greater in intensity than the respective PCLED wavelength range intensity (e.g., each light 250a, 250b outputs 120 lumens while each light 248a, 248b outputs 30 lumens).

In some embodiments, the target characteristic of the light 246 projected by the light fixture 200 includes a target wavelength range to correspond to a specific color or temperature of light (e.g., 400-660 nm, 430-660 nm, or the like). The light 246 projected by the light fixture 200 is limited to, for example, the target wavelength range. Stated another way, the color of the light 246 can be controlled by illuminating one or more of the PCLEDs 204a, 204b and/or one or more of the DLEDs 206a, 206b at various intensities.

Figure 3C:
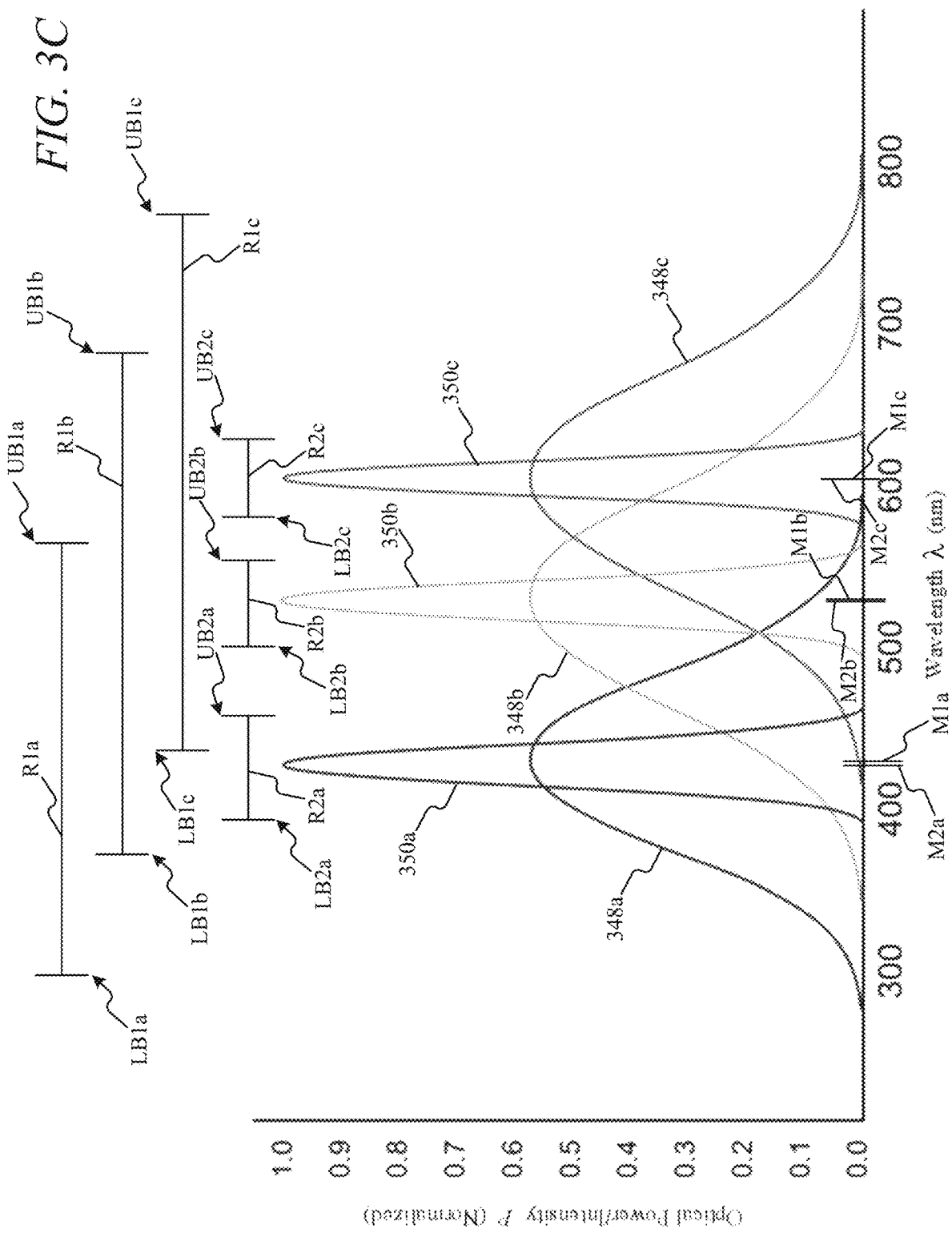
FIG. 3C illustrates a graph of light emitted by the light fixture of FIG. 1C comparing wavelength (in nanometers) to optical power (normalized).

With reference to FIG. 3C, a line graph representing an exemplary embodiment of the light 348a from the first PCLED 304a, the light 348b from the second PCLED 304b, the light 348c from the third PCLED 304b, the light 350a from the first DLED 306a, the light 350b from the second DLED 306b, and the light 350c from the third DLED 306c on the electromagnetic spectrum is shown. In the illustrated embodiment, the light 348a emitted by the first PCLED 304a includes generally blue light, the light 348b emitted by the second PCLED 304b includes generally green light, the light 348c emitted by the third PCLED 304c includes generally red light, the light 350a emitted by the first DLED 306a includes blue light, the light 350b emitted by the second DLED 306b includes green light, and the light 350c emitted by the third DLED 306c includes red light.

The characteristics of the light 348a of the first PCLED 304a correspond to the characteristics of the light 248a of the first PCLED 204a discussed above. The characteristics of the light 350a of the first DLED 306a correspond to the characteristics of the light 250a of the first DLED 206a discussed above. The characteristics of the light 348b of the second PCLED 304b correspond to the characteristics of the light 248b of the second PCLED 204b discussed above. The characteristics of the light 350b of the second DLED 306b correspond to the characteristics of the light 250b of the second DLED 206b discussed above. These characteristics, therefore, will not be discussed with respect to these embodiments.

As shown in FIG. 3C, the light 348c from the third PCLED 304c is emitted in a third PCLED wavelength range R1c that includes a third PCLED upper bound UB1c and a third PCLED lower bound LB1c. The light 350c from the third DLED 306c is emitted in a third DLED wavelength range R2c that includes a third DLED upper bound UB2c and a third DLED lower bound LB2c. The bounds UB1c, LB1c, UB2c, LB2c, are not necessarily wavelength values on the electromagnetic spectrum beyond which no light is emitted from the respective LED 304c, 306c.

Instead, in some embodiments, each of the bounds UB1c and LB1c, UB2c and LB2c represents a respective wavelength value beyond which lies only light 348c, 350c (respectively) that has an intensity value that is less than 10% of the peak intensity value of the respective light. In other embodiments, the intensity value is less than 5% of the peak intensity value. In still other embodiments, the intensity value is less than 1% of the peak intensity value. Stated another way, some embodiments include each wavelength range R1c, R2c having only light 348c, 350c (respectively) that has an intensity value that is greater than 1% of the peak intensity value of the respective light. Other embodiments include each wavelength range R1c, R2c having only light 348c, 350c (respectively) that has an intensity value that is greater than 5% of the peak intensity value. Still other embodiments include each wavelength range R1c, R2c having only light 348c, 350c (respectively) that has an intensity value that is greater than 10% of the peak intensity value.

In the illustrated embodiment in FIG. 3C, the third PCLED wavelength range R1c has a third PCLED upper bound UB1c (e.g., approximately 770 nm) that has a wavelength of a higher value than the third DLED upper bound UB2c (e.g., approximately 620 nm) of the third DLED wavelength range R2c. The third PCLED wavelength range R1c also has a third PCLED lower bound LB1c (e.g., approximately 430 nm) that has a wavelength of a lower value than the third DLED lower bound LB2c (e.g., approximately 580 nm) of the third DLED wavelength range R2c. Stated another way, the third DLED wavelength range R2c falls along the electromagnetic spectrum completely within the third PCLED wavelength range R1c.

The light 348c from the third PCLED 304c further includes a median third PCLED wavelength M1c, and the light 350c from the third DLED 306c includes a median third DLED wavelength M2c. In some embodiments, the median third PCLED wavelength M1c and the median third DLED wavelength M2c are within 50 nanometers of each other. In other embodiments, the median third PCLED wavelength M1c and the median third DLED wavelength M2c are within 25 nanometers of each other. In still other embodiments, the median third PCLED wavelength M1c and the median third DLED wavelength M2c are within 10 nanometers of each other. In still other embodiments, the median third PCLED wavelength M1c and the median third DLED wavelength M2c are the same wavelength value. Even more embodiments include the median third PCLED wavelength M1c and the median third DLED wavelength M2c being within 50-100 nanometers of each other, within 100-200 nanometers of each other, and more than 200 nanometers away from each other.

In some embodiments, the target characteristic of the light 346 projected by the light fixture 300 includes a third PCLED wavelength range intensity and a third DLED wavelength range intensity combining at a target ratio. In the illustrated embodiment in FIG. 3C, the blue light 348a emitted from the first PCLED 304a combines with the blue light 350a emitted from the first DLED 306a at a target ratio, the green light 348b emitted from the second PCLED 304b combines with the green light 350b emitted from the second DLED 306b at a target ratio, and the red light 348c emitted from the third PCLED 304c combines with the red light 350c emitted from the third DLED 306c at a target ratio. In some embodiments, the target ratio includes each of the DLED wavelength range intensities being at least two times greater than the respective PCLED wavelength range intensity (e.g., each light 350a, 350b, 350c outputs 60 lumens while each light 348a, 348b, 348c outputs 30 lumens). In some embodiments, each DLED wavelength range intensity is at least three times greater in intensity (along the Y-axis labeled optical power) than the respective PCLED wavelength range intensity (e.g., each light 350a, 350b, 350c outputs 90 lumens while each light 348a, 348b, 348c outputs 30 lumens). In some embodiments, each DLED wavelength range intensity is at least four times greater in intensity than the respective PCLED wavelength range intensity (e.g., each light 350a, 350b, 350c outputs 120 lumens while each light 348a, 348b, 348c outputs 30 lumens).

In some embodiments, the target characteristic of the light 346 projected by the light fixture 300 includes a target wavelength range to correspond to a specific color or temperature of light (e.g., 400-660 nm, 430-660 nm, or the like). The light 346 projected by the light fixture 300 is limited to, for example, the target wavelength range. Stated another way, the color of the light 346 can be controlled by illuminating one or more of the PCLEDs 304a, 304b, 304c and/or one or more of the DLEDs 306a, 306b, 306c at various intensities.

Figure 4:
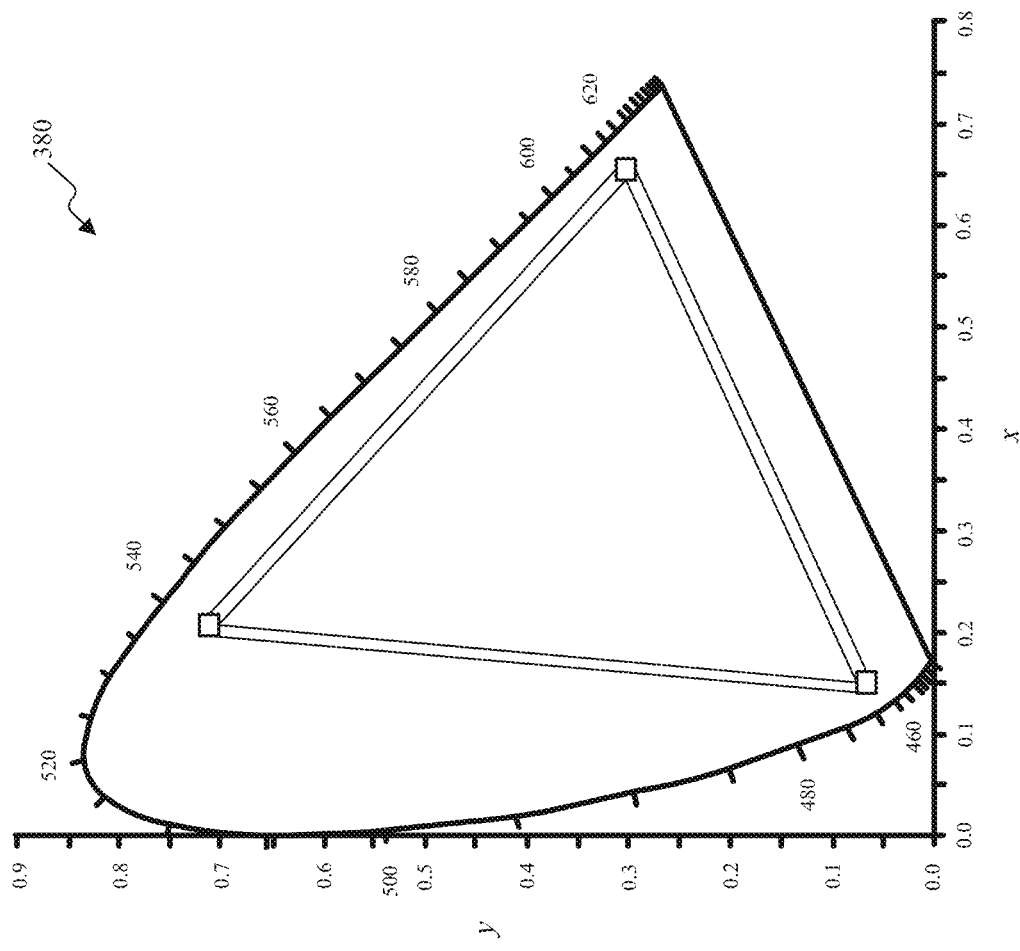
FIG. 4 illustrates a gamut of the phosphor-converted light-emitting diodes of the light fixture of FIG. 1C, according to embodiments described herein.

With reference to FIG. 4, an example available color gamut 380 of the PCLEDs 304a, 304b, 304c of the light fixture 300 is shown. In some embodiments, only colors that fall within or on the illustrated color gamut polygon are reproducible by the PCLEDs 304a, 304b, 304c of the light fixture 300. As discussed above, the output intensity of each of the PCLEDs 304a, 304b, 304c is adjusted until the light 346 is within a threshold or error value for the target ratio.

Figure 5:
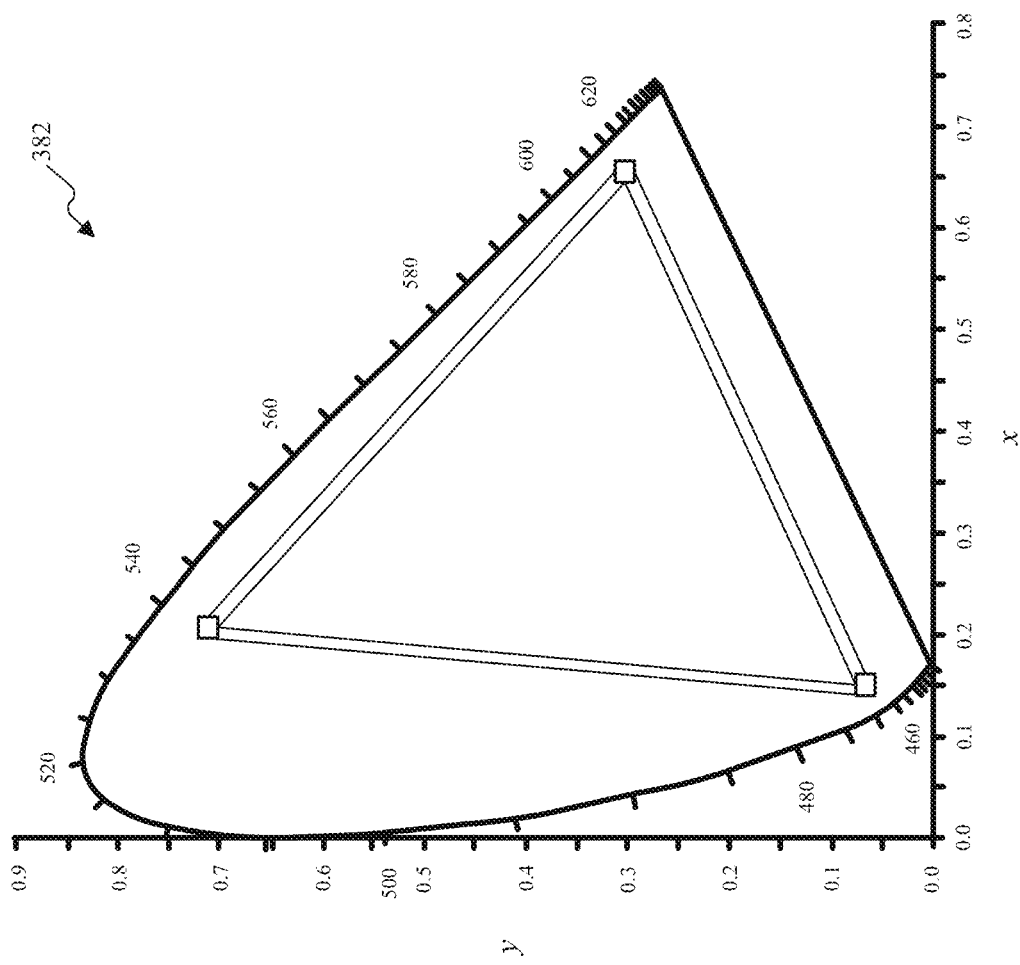
FIG. 5 illustrates a gamut of the direct light-emitting diodes of the light fixture of FIG. 1C, according to embodiments described herein.

With reference to FIG. 5, an example available color gamut 382 of the DLEDs 306a, 306b, 306c of the light fixture 300 is shown. In some embodiments, only colors that fall within or on the illustrated color gamut polygon are reproducible by the DLEDs 306a, 306b, 306c of the light fixture 300. As discussed above, the output intensity of each of the DLEDs 306a, 306b, 306c is adjusted until the light 346 is within a threshold or error value for the target ratio. In some embodiments, the available color gamut 382 of the DLEDs 306a, 306b, 306c is substantially the same as the available color gamut 380 of the PCLEDs 304a, 304b, 304c. In some embodiments, the available color gamut 382 of the DLEDs 306a, 306b, 306c is the same as the available color gamut 380 of the PCLEDs 304a, 304b, 304c.

With reference to FIG. 6, a process (or method) 400 of driving LEDs 104, 106 in the light fixture 100, driving LEDs 204a, 204b, 206a, 206b in the light fixture 200, or driving LEDs 304a, 304b, 304c, 306a, 306b, 306c in the light fixture 300 is shown. The process 400 includes the light fixture 100, 200, 300 having PCLEDs 104, 204a, 204b, 304a, 304b, 304c emitting light 148, 248a, 248b, 348a, 348b, 348c in a PCLED wavelength range R1, R1a, Rib, R1c and DLEDs 106, 206a, 206b, 306a, 306b, 306c emitting light 150, 250a, 250b, 350a, 350b, 350c in a DLED wavelength range R2, R2a, R2b, R2c that is within (e.g., completely within) the respective PCLED wavelength range R1, R1a, Rib, R1c.

At step 402, a signal related to a target characteristic of the light 146, 246, 346 is received. At step 404, a PCLED output value is determined for at least one of the PCLEDs 104, 204a, 204b, 304a, 304b, 304c based on the target characteristic of the light 146, 246, 346 to be projected by the light fixture 100, 200, 300. At step 406 (which may occur after step 404, during step 404, or before step 404), a DLED output value is determined for at least one of the DLEDs 106, 206a, 206b, 306a, 306b, 306c based on the target characteristic of the light 146, 246, 346 to be projected by the light fixture 100, 200, 300. At step 408, the at least one of the PCLEDs 104, 204a, 204b, 304a, 304b, 304c is driven at the PCLED output value. At step 410 (which may occur after step 408, during step 408, or before step 408), the at least one of the DLEDs 106, 206a, 206b, 306a, 306b, 306c is driven at the DLED output value.

In some embodiments, steps 404 and 406 include the respective output values of the PCLEDs 104, 204a, 204b, 304a, 304b, 304c and the DLEDs 106, 206a, 206b, 306a, 306b, 306c being determined based on a target color ratio made up of at least a first color wavelength range intensity and a second color wavelength range intensity. In some embodiments, the target color ratio includes the light 148, 248a, 248b, 348a, 348b, 348c emitted from the respective PCLED 104, 204a, 204b, 304a, 304b, 304c being at least two times greater, at least three times greater, or at least four times greater in intensity than the light 150, 250a, 250b, 350a, 350b, 350c emitted from a corresponding DLED 106. In other embodiments, the target color ratio includes the light 150, 250a, 250b, 350a, 350b, 350c emitted from the respective DLED 106, 206a, 206b, 306a, 306b, 306c being at least two times greater, at least three times greater, or at least four times greater in intensity than the light 148, 248a, 248b, 348a, 348b, 348c emitted from a corresponding PCLED 104, 204a, 204b, 304a, 304b, 304c.

In other embodiments, steps 404 and 406 include the respective output values of the PCLEDs 104, 204a, 204b, 304a, 304b, 304c and the DLEDs 106, 206a, 206b, 306a, 306b, 306c being determined based on a target wavelength range of the light 146, 246, 346 produced by the light fixture 100, 200, 300. In such embodiments, steps 408 and 410 limit the light 146, 246, 346 produced by the light fixture 100, 200, 300 to the target wavelength range.

In some embodiments, at one setting of the light fixture 100, 200, 300, step 404 includes determining a PCLED output value that illuminates one or more PCLEDs 104, 204a, 204b, 304a, 304b, 304c to produce the target characteristic of the light 146, 246, 346 projected by the light fixture 100, 200, 300. At this stetting, step 406 includes determining a DLED output value that does not illuminate the DLEDs 106, 206a, 206b, 306a, 306b, 306c. Stated another way, only one or more of the PCLEDs 104, 204a, 204b, 304a, 304b, 304c illuminates to produce the target characteristic of the light 146, 246, 346 projected by the light fixture 100, 200, 300.

In some embodiments, at another setting of the light fixture 100, 200, 300, step 404 includes determining a PCLED output value that does not illuminate the PCLEDs 104, 204a, 204b, 304a, 304b, 304c. At this setting, step 406 includes determining a DLED output value that illuminates one or more DLEDs 106, 206a, 206b, 306a, 306b, 306c to produce the target characteristic of the light 146, 246, 346 projected by the light fixture 100, 200, 300. Stated another way, only one or more of the DLEDs 106, 206a, 206b, 306a, 306b, 306c illuminates to produce the target characteristic of the light 146, 246, 346 projected by the light fixture 100, 200, 300.

In addition to the embodiments disclosed above, some embodiments include narrow band PCLEDs instead of DLEDs. In such embodiments, these narrow band PCLEDs use a layer of phosphor material similar to the PCLEDs described above. The narrow band PCLEDs, however, emit light in a narrower band on the electromagnetic spectrum than the PCLEDs described above. In some embodiments, the narrow band PCLEDs emit light in a band on the electromagnetic spectrum that is the same as or substantially similar to light emitted from an equivalent DLED as explained above.

The definition of "broadband" can be considered in some embodiments to be a band of light on the electromagnetic spectrum that is wider than 70 nm. Other embodiments include the band of light being equal to or wider than 80 nm. Still other embodiments include the band of light being equal to or wider than 90 nm. Yet other embodiments include the band of light being equal to or wider than 100 nm.

The definition of "narrow band" can be considered in some embodiments to be a band of light on the electromagnetic spectrum that is narrower than 70 nm. Other embodiments include the band of light being equal to or narrower than 60 nm. Still other embodiments include the band of light being equal to or narrower than 50 nm. Yet other embodiments include the band of light being equal to or narrower than 40 nm.

Thus, the embodiments described herein provide, among other things, systems, methods, and devices for controlling the spectral content of an output of a light fixture. Various features and advantages of the embodiments described herein are set forth in the following claims.

What is claimed is:

1. A light fixture comprising:
   a housing;
   a first light-emitting diode disposed in the housing;
   a first phosphor layer associated with the first light-emitting diode ("LED"), forming a first phosphor-converted light-emitting diode ("PCLED"), the first PCLED configured to emit light in a first PCLED wavelength range including a first PCLED upper bound and a first PCLED lower bound;
   a second LED disposed in the housing;
   a second phosphor layer associated with the second LED, forming a second PCLED, the second PCLED configured to emit light in a second PCLED wavelength range including a second PCLED upper bound and a second PCLED lower bound;
   a third LED disposed in the housing, the third LED configured to emit light in a third LED wavelength range including a third LED upper bound and a third LED lower bound;
   a fourth LED disposed in the housing, the fourth LED configured to emit light in a fourth LED wavelength range including a fourth LED upper bound and a fourth LED lower bound;
   wherein the first PCLED upper bound of the first PCLED wavelength range has a higher wavelength value than the third LED upper bound of the third LED wavelength range;
   wherein the first PCLED lower bound of the first PCLED wavelength range has a lower wavelength value than the third LED lower bound of the third LED wavelength range;
   wherein the second PCLED upper bound of the second PCLED wavelength range has a higher wavelength value than the fourth LED upper bound of the fourth LED wavelength range; and
   wherein the second PCLED lower bound of the second PCLED wavelength range has a lower wavelength value than the fourth LED lower bound of the fourth LED wavelength range.

2. The light fixture of claim 1, further comprising
   a third phosphor layer associated with the third LED, forming a third PCLED, the third PCLED configured to emit light in the third LED wavelength range;
   a fourth phosphor layer associated with the fourth LED, forming a fourth PCLED, the fourth PCLED configured to emit light in the fourth LED wavelength range; and
   wherein
      the first PCLED and the second PCLED are broadband PCLEDs; and
      the third LED and the fourth LED are narrow band PCLEDs.

3. The light fixture of claim 1, wherein
   the third LED is a first direct light-emitting diode ("DLED");
   the third LED wavelength range is a first DLED wavelength range;
   the third LED upper bound is a first DLED upper bound;
   the third LED lower bound is a first DLED lower bound;
   the fourth LED is a second DLED;
   the fourth LED wavelength range is a second DLED wavelength range;
   the fourth LED upper bound is a second DLED upper bound; and
   the fourth LED lower bound is a second DLED lower bound.

4. The light fixture of claim 3, wherein
   the first phosphor layer absorbs light from the first light-emitting diode, and the first phosphor layer emits the absorbed light within the first PCLED wavelength range; and
   the second phosphor layer absorbs light from the second light-emitting diode, and the second phosphor layer emits the absorbed light within the second PCLED wavelength range.

5. The light fixture of claim 3, wherein
   the light emitted in the first PCLED wavelength range includes a median first PCLED wavelength;
   the light emitted in the first DLED wavelength range includes a median first DLED wavelength;
   the median first PCLED wavelength and the median first DLED wavelength are within 25 nanometers of each other;
   the light emitted in the second PCLED wavelength range includes a median second PCLED wavelength;
   the light emitted in the second DLED wavelength range includes a median second DLED wavelength; and
   the median second PCLED wavelength and the median second DLED wavelength are within 25 nanometers of each other.

6. The light fixture of claim 3, further comprising
   a fifth LED disposed in the housing;
   a third phosphor layer associated with the fifth LED, forming a third PCLED, the third PCLED configured to emit light in a third PCLED wavelength range including a third PCLED upper bound and a third PCLED lower bound;
   a sixth LED disposed in the housing, the sixth LED being a third DLED, the third DLED configured to emit light in a third DLED wavelength range including a third DLED upper bound and a third DLED lower bound;
   wherein the third PCLED upper bound of the third PCLED wavelength range has a higher wavelength value than the third DLED upper bound of the third DLED wavelength range; and
   wherein the third PCLED lower bound of the third PCLED wavelength range has a lower wavelength value than the third DLED lower bound of the third DLED wavelength range.

7. A lighting system comprising:
   a light fixture including
      a first phosphor-converted light-emitting diode ("PCLED") configured to emit light in a first PCLED wavelength range,
      a first direct light-emitting diode ("DLED") configured to emit light in a first DLED wavelength range, the first DLED wavelength range falling completely within the first PCLED wavelength range,
      a second PCLED configured to emit light in a second PCLED wavelength range, and
      a second DLED configured to emit light in a second DLED wavelength range, the second DLED wavelength range falling completely within the second PCLED wavelength range; and
   a controller configured to
      receive a control signal corresponding to a target characteristic of light to be projected by the light fixture,
      determine a first PCLED output value for the first PCLED based on the control signal,
      determine a first DLED output value for the first DLED based on the control signal, determine a second PCLED output value for the second PCLED based on the control signal, determine a second DLED output value for the second DLED based on the control signal, drive the first PCLED at the first PCLED output value, drive the first DLED at the first DLED output value, drive the second PCLED at the second PCLED output value, and drive the second DLED at the second DLED output value.

8. The lighting system of claim 7, wherein the target characteristic of the light to be projected by the light fixture includes a first DLED wavelength range intensity and a first PCLED wavelength range intensity combining at a target ratio; and the color ratio includes the first DLED wavelength range intensity being at least two times greater than the first PCLED wavelength range intensity.

9. The lighting system of claim 7, wherein the target characteristic of the light to be projected by the light fixture includes a target wavelength range; and the light to be projected by the light fixture is limited to the target wavelength range.

10. The lighting system of claim 7, wherein the first DLED output value does not illuminate the first DLED and the first PCLED output value does illuminate the first PCLED to produce the target characteristic of the light to be projected by the light fixture.

11. The lighting system of claim 7, wherein the first PCLED output value does not illuminate the first PCLED and the first DLED output value does illuminate the first DLED to produce the target characteristic of the light to be projected by the light fixture.

12. The lighting system of claim 7, wherein the light emitted in the first PCLED wavelength range includes a median first PCLED wavelength;

the light emitted in the first DLED wavelength range includes a median first DLED wavelength; and the median first PCLED wavelength and the median first DLED wavelength are within 25 nanometers of each other.

13. The lighting system of claim 7, wherein the light fixture further includes a third PCLED configured to emit light in a third PCLED wavelength range, and a third DLED configured to emit light in a third DLED wavelength range, the third DLED wavelength range falling completely within the third PCLED wavelength range; and the controller is further configured to determine a third PCLED output value for the third PCLED based on the control signal, determine a third DLED output value for the third DLED based on the control signal, drive the third PCLED at the third PCLED output value, and drive the third DLED at the third DLED output value.

14. A method for driving light-emitting diodes in a light fixture, the light fixture including at least a first phosphor-converted light-emitting diode ("PCLED") that emits light in a first PCLED wavelength range, a second PCLED that emits light in a second PCLED wavelength range, a first direct light-emitting diode ("DLED") that emits light in a first DLED wavelength range, and a second DLED that emits light in a second DLED wavelength range, the first DLED wavelength range being within the first PCLED wavelength range and the second DLED wavelength range being within the second PCLED wavelength range, the method comprising:

determining a first PCLED output value for the first PCLED based on a target characteristic of light to be projected by the light fixture;

determining a first DLED output value for the first DLED based on the target characteristic of light to be projected by the light fixture;

determining a second PCLED output value for the second PCLED based on the target characteristic of light to be projected by the light fixture;

determining a second DLED output value for the second DLED based on the target characteristic of the light to be projected by the light fixture;

driving the first PCLED at the PCLED output value;

driving the first DLED at the first DLED output value;

driving the second PCLED at the second PCLED output value; and driving the second DLED at the second DLED output value.

15. The method of claim 14, wherein the target characteristic of the light to be projected by the light fixture includes a first DLED wavelength range intensity and a first PCLED wavelength range intensity combining at a target ratio; and the target ratio includes the first DLED wavelength range intensity being at least two times greater than the first PCLED wavelength range intensity.

16. The method of claim 14, wherein the target characteristic of the light to be projected by the light fixture includes a target wavelength range.

17. The method of claim 14, wherein the first DLED output value does not illuminate the first DLED; and the first PCLED output value does illuminate the first PCLED to produce the target characteristic of the light to be projected by the light fixture.

18. The method of claim 14, wherein the first PCLED output value does not illuminate the first PCLED; and the first DLED output value does illuminate the first DLED to produce the target characteristic of the light to be projected by the light fixture.

19. The method of claim 14, wherein the light emitted in the first PCLED wavelength range includes a corresponding median first PCLED wavelength;

the light emitted in the first DLED wavelength range includes a corresponding median first DLED wavelength;

the light emitted in the second PCLED wavelength range includes a corresponding median second PCLED wavelength;

the light emitted in the second DLED wavelength range includes a corresponding median second DLED wavelength;

the median first PCLED wavelength and the median first DLED wavelength are within 25 nanometers of each other; and the median second PCLED wavelength and the median second DLED wavelength are within 25 nanometers of each other.

20. The method of claim 14, wherein the light fixture further includes a third PCLED that emits light in a third PCLED wavelength range and a third DLED that emits light in a third DLED wavelength range, the third DLED wavelength range being within the third PCLED wavelength range, the method further comprising
  determining a third PCLED output value for the third PCLED based on the target characteristic of light to be projected by the light fixture;
  determining a third DLED output value for the third DLED based on the target characteristic of the light to be projected by the light fixture;
  driving the third PCLED at the third PCLED output value; and
  driving the third DLED at the third DLED output value.

* * * * *